(12) United States Patent
Hansen

(10) Patent No.: US 7,372,540 B2
(45) Date of Patent: May 13, 2008

(54) LITHOGRAPHIC APPARATUS AND DEVICE MANUFACTURING METHOD

(75) Inventor: Steve George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 361 days.

(21) Appl. No.: 11/090,697

(22) Filed: Mar. 28, 2005

(65) Prior Publication Data

US 2006/0078805 A1    Apr. 13, 2006

Related U.S. Application Data

(60) Provisional application No. 60/617,085, filed on Oct. 12, 2004.

(51) Int. Cl.
G03B 27/42 (2006.01)
G03B 27/54 (2006.01)
G03B 27/32 (2006.01)

(52) U.S. Cl. .............................. 355/53; 355/67; 355/77

(58) Field of Classification Search ................. 355/53, 355/67, 77; 430/5
See application file for complete search history.

(56) References Cited

U.S. PATENT DOCUMENTS

| | | | |
|---|---|---|---|
| 5,253,040 | A | 10/1993 | Kamon et al. |
| 5,627,626 | A | 5/1997 | Inoue et al. |
| 6,358,856 | B1 | 3/2002 | Lyons et al. |
| 6,452,662 | B2 | 9/2002 | Mulkens et al. |
| 6,664,011 | B2 | 12/2003 | Lin et al. |
| 6,671,035 | B2 | 12/2003 | Eurlings et al. |
| 2001/0001247 | A1 | 5/2001 | Finders et al. |
| 2002/0152452 | A1 | 10/2002 | Socha |
| 2002/0177054 | A1 | 11/2002 | Saitoh et al. |
| 2003/0073013 | A1 | 4/2003 | Hsu et al. |
| 2004/0137343 | A1 | 7/2004 | Eurlings et al. |
| 2004/0156029 | A1 | 8/2004 | Hansen |
| 2004/0158808 | A1 | 8/2004 | Hansen |
| 2004/0169838 | A1 | 9/2004 | Lee |
| 2004/0229133 | A1 | 11/2004 | Socha et al. |
| 2005/0142470 | A1 | 6/2005 | Socha et al. |
| 2006/0146307 | A1 | 7/2006 | Hansen et al. |
| 2006/0256311 | A1 | 11/2006 | Hansen et al. |

OTHER PUBLICATIONS

Wim Bogaerts et al., "Tolerance Control for Photonic Crystal Structures Fabricated With Deep UV Lithography," Ghent University- IMEC Dept. of Information Technology (Belgium), p. Two Pages.

(Continued)

Primary Examiner—Rodney Fuller
(74) Attorney, Agent, or Firm—Pillsbury Winthrop Shaw Pittman LLP

(57) ABSTRACT

By proper selection of illumination configuration, mask transmission, and mask bias, complex patterns of contact holes may be imaged with sufficient latitude for manufacturing at minimum half-pitches of $k_1=0.40$ or below. In an embodiment, a method of transferring an image of a mask pattern onto a substrate with a lithographic apparatus is presented. The method includes illuminating a mask pattern of an attenuated phase shift mask with an illumination configuration including on-axis and off-axis components, the off-axis component of the illumination being an annular illumination extending near a pupil edge, and projecting an image of the illuminated mask pattern onto the substrate.

11 Claims, 23 Drawing Sheets

OTHER PUBLICATIONS

Vincent Wiaux et al., "ArF solutions for low-k1 back-end imaging," Optical Microlithography XVI, Proceedings of SPIE, p. 270-281, (2003).

Will Conley et al., "Mighty High-T Lithography for 65 nm Generation Contacts," Optical Microlithography XVI, Proceedings of SPIE, p. 1210-1219, (2003).

Carsten Kohler et al., "Optical Solutions for Contact Hole Lithography at the 90nm Node and Beyond," p. 10 Pages.

Mark D. Levenson et al., "The Vortex Mask: Making 80nm Contacts With a Twist," 22nd Annual Bacus Symposium on Photomask Technology, Proceeding of SPIE, vol. 4889 (2002).

European Search Report issued for European Application Patent No. 05256021.6, dated Nov. 30, 2005.

LITHOGRAPHIC APPARATUS AND DEVICE MANUFACTURING METHOD

PRIORITY AND BENEFIT INFORMATION

This application claims priority and benefit to U.S. Provisional Patent Application Ser. No. 60/617,085, entitled "Lithographic Apparatus And Device Manufacturing Method", filed on Oct. 12, 2004. The content of that application is incorporated herein in its entirety by reference.

FIELD

This invention relates to lithographic apparatus and methods.

BACKGROUND

A lithographic apparatus is a machine that applies a desired pattern onto a target portion of a substrate. Lithographic apparatus can be used, for example, in the manufacturing of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

Photolithography is widely recognized as one of the key steps in the manufacturing of ICs and other devices and products with small features. However, as the dimensions of features become smaller, photolithography is becoming one of the most, if not the most, critical gating factors for enabling ICs and other devices and products with small features to be manufactured on a massive scale.

A theoretical estimate of the limits of feature printing can be given by the Rayleigh criterion for resolution R as shown in equation (1):

$$R = k_1 * \frac{\lambda}{NA} \quad (1)$$

where $\lambda$ is the wavelength of the radiation used, NA is the numerical aperture of the projection system used to image the feature, and $k_1$ is a process dependent adjustment factor, also called the Rayleigh constant.

It follows from equation (1) that the resolution of any given feature can be improved in three ways: by shortening the exposure wavelength $\lambda$, by increasing the numerical aperture NA, or by decreasing the value of $k_1$. All of these strategies have been pursued simultaneously in the past and are expected to continue in the future. For conventional optical lithography, the ultimate resolution limit is reached at $k_1=0.5$, which corresponds to the state at which only one set of diffracted orders can pass through the projection system. The resolution limit of $k_1=0.5$ stands firm even as exposure wavelengths decrease from 248 nm to 193 nm and 157 nm, and numerical aperture increases from 0.5 to 0.75.

One solution that was recently proposed to print complex patterns with sufficient latitude for manufacturing ICs at minimum half pitches of $k_1=0.5$ or below, is to use a vortex mask. (See Mark D. Levenson et al., "The Vortex Mask: Making 80 nm Contacts with a Twist!", $22^{nd}$ Annual BACUS Symposium on Photomask Technology, Proceeding of SPIE Vol. 4889 (2002)). A vortex mask is composed of rectangles with phases of 0 degrees, 90 degrees, 180 degrees and 270 degrees. The walls of the phase trenches are nearly vertical, with all four-phase regions meeting at sharp corners, which define the phase singularities. Because the phase of the wave front is not defined at the corner where the rectangles with the four different phases meet, the intensity at that point is zero. In other words, the central core of the vortex is dark. Therefore, after traversing the vortex mask, the radiation wavefront spirals like a vortex and has a zero amplitude on its central core, instead of forming a plane or a sphere. In combination with a negative resist process, the central axis dark spot of the optical vortex transferred onto the substrate may potentially support larger process windows at small $k_1$ (based on half pitch) than conventional methods and may allow for smaller features to be printed with acceptable process latitude. However, a successful implementation of this technology requires the development of appropriate negative-resist tone processes which may be complicated and costly.

SUMMARY

By proper selection of illumination configuration, mask transmission (i.e. attenuated phase shift mask (att-PSM)), and mask bias, complex patterns of contact holes may be imaged with sufficient latitude for manufacturing at minimum half-pitches with $k_1=0.40$ or below. An embodiment includes an illumination configuration that includes both off-axis and on-axis elements, is angularly symmetric, and extends to near the pupil edge. Appropriate selection of illumination configuration details, mask transmission, and mask bias allow lithographic responses such as depth of focus, mask error enhancement factor, and hole shape integrity to be traded-off against each other and to be optimized.

In an embodiment, an attenuated phase shift mask is combined with on-axis and off-axis illumination (to give sufficient depth of focus (DOF) for both isolated and more densely packed holes), the off-axis illumination being circularly symmetric and extending near the pupil edge. In an embodiment of the invention, an appropriate hole biasing is provided to allow complex hole patterns to be printed with relatively high DOF and low MEEF without placing a high density of complex assist features on the mask.

In an embodiment, there is provided a method including illuminating a mask pattern of an attenuated phase shift mask with a beam of radiation including on-axis and off-axis components, the off-axis component being circularly symmetric and extending near a pupil edge of an illuminator, and projecting the patterned beam onto a substrate. In an embodiment, the mask pattern has a mask pattern bias to transfer an image of the mask pattern to a desired dimension onto the substrate.

In another embodiment, there is provided a lithographic apparatus including an illuminator configured to condition a beam of radiation and to configure the beam of radiation to have on-axis and off-axis components, the off-axis component being circularly symmetric and extending near the pupil edge of the illuminator, a support structure configured to hold a patterning device, the patterning device configured to pattern the beam of radiation according to a desired pattern and comprising an attenuated phase-shift mask, a substrate table configured to hold a substrate and a projection system configured to project the patterned beam of radiation onto the substrate.

In yet another embodiment, there is provided a method for configuring an illumination condition of random features in a mask pattern, the method including configuring an illumination condition of a first grid including a plurality of the features, the plurality of features being arranged in a first pitch in the first grid; configuring an illumination condition of a second grid including a plurality of the features, the second grid being rotated with respect to the first grid; and determining the illumination condition of the random features based on the illumination condition of the first grid and the illumination condition of the second grid.

In an embodiment, there is provided a computer product having machine executable instructions, the instructions being executable by a machine to perform a method of configuring an illumination condition of random features in a mask pattern, the method including configuring an illumination condition of a first grid including a plurality of the features, the plurality of features being arranged in a first pitch in the first grid; configuring an illumination condition of a second grid including a plurality of the features, the second grid being rotated with respect to the first grid; and determining the illumination condition of the random features based on the illumination condition of the first grid and the illumination condition of the second grid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9b shows the schematic random pattern used in FIG. 9a;

FIG. 11b shows the multipole illumination configuration used in FIG. 11a;

FIG. 12b shows the multipole illumination configuration used in FIG. 12a;

FIG. 13b shows a cross section of the bullseye illumination configuration used in FIG. 13a;

FIG. 14b shows a cross section of the bullseye illumination configuration used in FIG. 14a;

FIG. 15b shows a cross section of the bullseye illumination configuration used in FIG. 15a.

DETAILED DESCRIPTION

Figure 1:
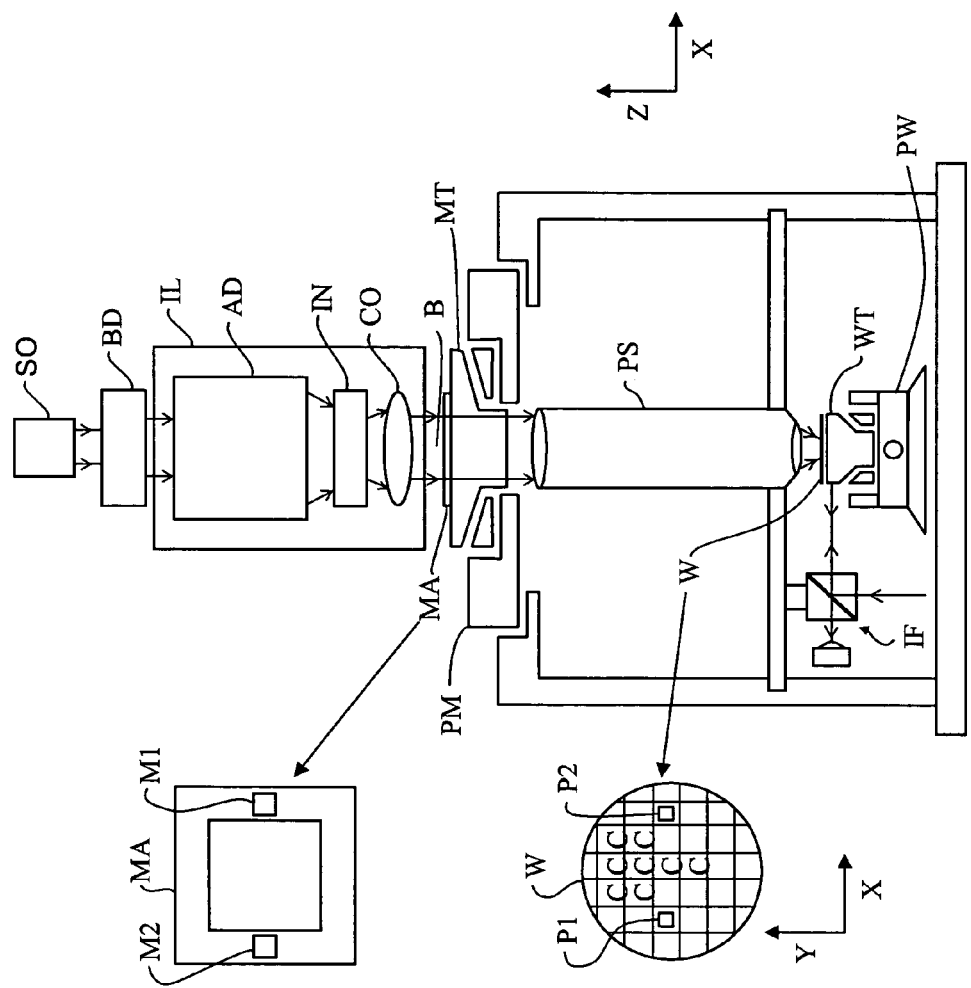
FIG. 1 represents a lithographic apparatus in accordance with an embodiment of the invention.

FIG. 1 schematically depicts a lithographic apparatus according to an embodiment of the invention. The apparatus includes an illumination system (illuminator) IL adapted to condition a beam B of radiation (e.g. UV radiation) and a support structure (e.g. a mask table) MT configured to hold a patterning device (e.g. a mask) MA and connected to a first positioning device PM configured to accurately position the patterning device with respect to the projection system PS (e.g., a projection lens). The apparatus also includes a substrate table (e.g. a wafer table) WT configured to hold a substrate (e.g. a resist-coated wafer) W and connected to a second positioning device PW configured to accurately position the substrate with respect to the projection system PS. The apparatus also includes the projection system (e.g. a refractive projection lens) PS adapted to image a pattern imparted to the beam B by the patterning device MA onto a target portion C (e.g. including one or more dies) of the substrate W.

As depicted here, the apparatus is of a transmissive type (e.g. employing a transmissive mask). Alternatively, the apparatus may be of a reflective type (e.g. employing a programmable mirror array of a type as referred to below or a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD, including for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may include an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation B.

The beam of radiation B is incident on the patterning device MA, which is held on the support structure MT. Having traversed the patterning device MA, the beam of radiation B passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam B. Similarly, the first positioning device PM and another position sensor (which is not explicitly depicted in FIG. 2) can be used to accurately position the patterning device MA with respect to the path of the beam B, e.g. after mechanical retrieval from a mask library, or during a scan. In general, movement of the support structure MT and the substrate table WT will be realized with the aid of a long-stroke module (coarse positioning) and a short-stroke module (fine positioning), which form part of one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus may be used in the following preferred modes:

1. In step mode, the support structure MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam of radiation is projected onto a target portion C (i.e. a single dynamic exposure). The velocity and direction of the substrate table WT relative to the support structure MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

Historically, the resolution limit of a lithographic projection apparatus was optimized by the control of the relative size of the illuminator numerical aperture ($NA_{ill}$). Control of $NA_{ill}$ with respect to the projection system's numerical aperture ($NA_{ps}$) allows for modification of spatial coherence at the patterning device (mask) plane, commonly referred to as partial coherence σ, where:

$$\sigma = (NA_{ill})/(NA_{ps})$$

This is typically accomplished through specification of the condenser lens pupil in a Köhler illumination system. Essentially, this allows for manipulation of the optical processing of diffraction information. Optimization of the partial coherence of a projection imaging system is conventionally accomplished using full circular illumination apertures (conventional or sigma illumination configuration). By controlling the distribution of diffraction information in the projection system with the illuminator pupil size, maximum image modulation may be obtained.

In order to enhance the resolution and the depth of focus (DOF) of the lithographic apparatus, various enhancement techniques may also be used. These techniques include optical proximity correction (OPC) of optical proximity errors (OPE), phase shift masks (PSM), and sub-resolution assist features (SRAF). Each technique may be used alone or in combination with other techniques to increase the resolution.

However, conventional illumination configurations and conventional enhancement techniques have limited capabilities and typically cannot print half-pitches below $k_1$=0.4. Generally, the best setting that may be accomplished with a conventional illumination configuration using full circular illumination apertures and a phase shift mask is $k_1$=0.45-0.5. However, this setting may not be sufficient to correctly image small contact holes (i.e. smaller than 100 nm) with sufficient latitude. Contact holes are not only one of the smallest structures but they are also a three dimensional structure rendering the requirement on the depth of focus (DOF) even more stringent. Furthermore, a high contrast image of sufficient quality that includes a plurality of contact holes, such as contact arrays, may be especially hard to print as the pitch is shrunk.

Figure 2:
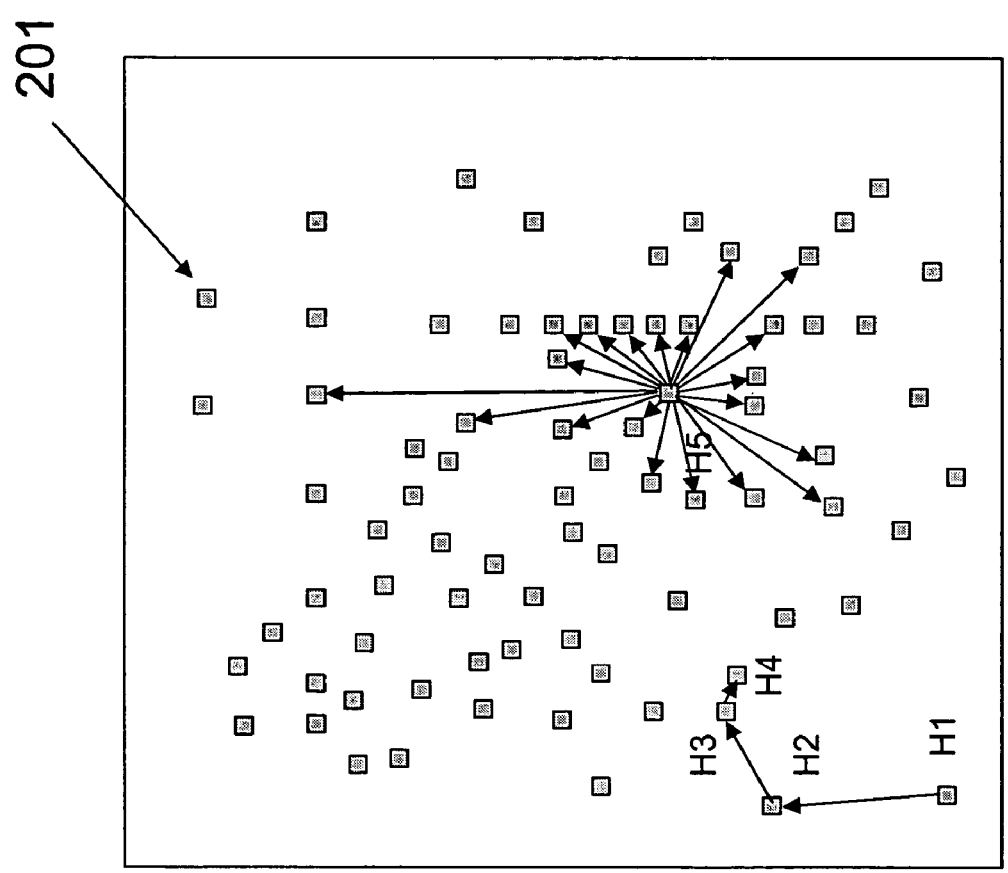
FIG. 2 shows a schematic random pattern.

These imaging requirements may be rendered even more challenging with random contact hole patterns. A schematic example of a random pattern of contact holes 201 is illustrated in FIG. 2. As can be seen in this figure, the nearest neighbor's coordinates for some of the contact holes (e.g., H1-H4) may significantly vary, thus rendering the printing process difficult. For example, the distance between hole Hi and its nearest neighbor H2 is significantly larger than the distance between hole H3 and its nearest neighbor H4. Furthermore, the orientation of hole H2 relative to hole H1 is significantly different from that of hole H4 relative to hole H3. This figure also shows that a hole (e.g. H5) may have variable spacing and angular orientation relative to its neighboring holes.

It is proposed in an embodiment of the invention to configure the illumination conditions of the lithographic apparatus to print random patterns of small features, such as the one shown in FIG. 2. Specifically, in an embodiment, it is proposed to model a random pattern of small features with multiple non-random patterns having different orientations and to separately find the illumination conditions for each of them. These non-random patterns include the same features which may be arranged in different pitches. Illumination condition results for these non-random patterns can then be used to determine the illumination condition for the random pattern. Since calculation of the electric field in the substrate plane is a linear process, the electric field of the random pattern is calculated through superposition. In superposition, the electric field is the summation of the individual contributions from each non-random pattern.

Figure 3:
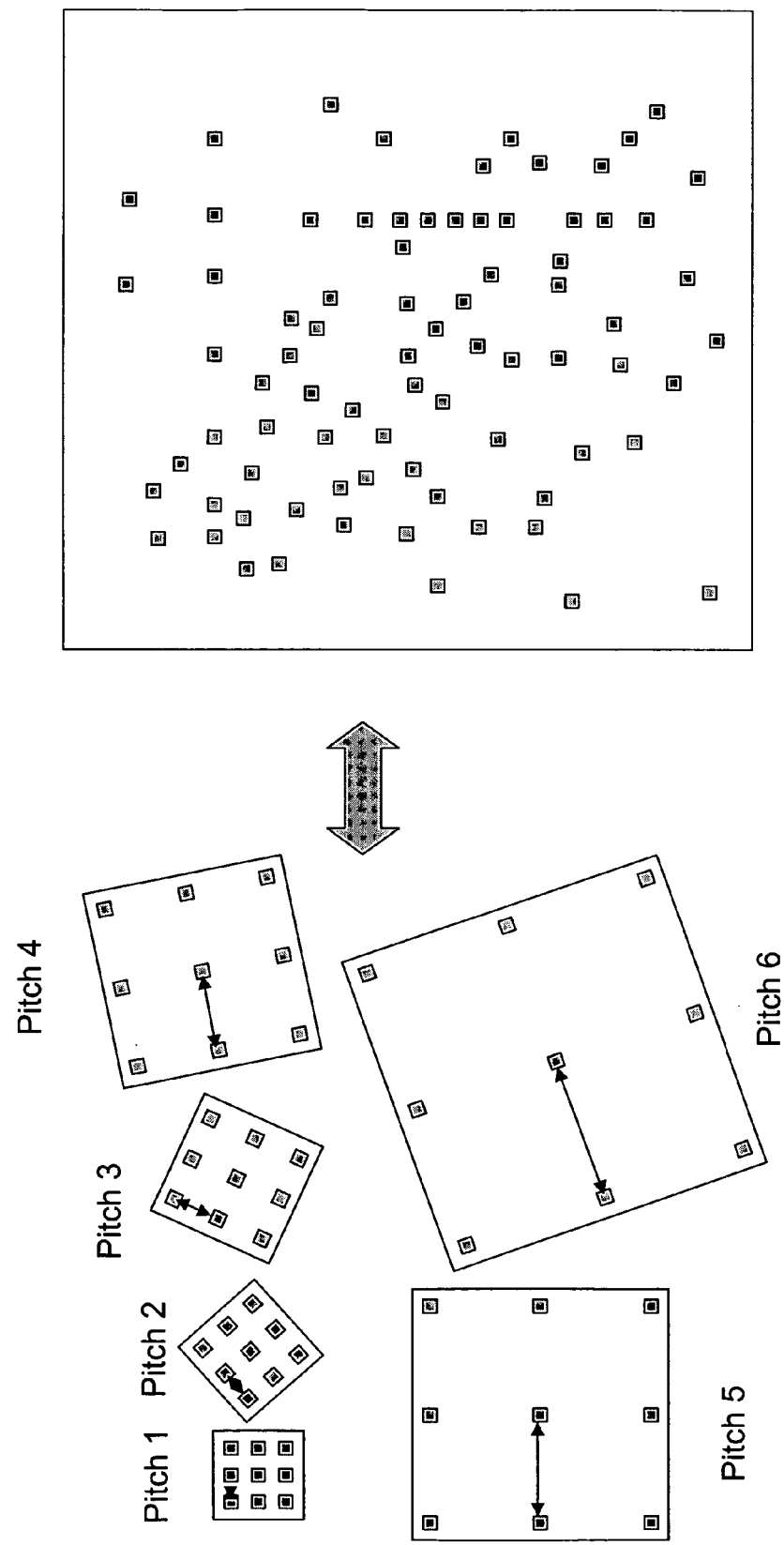
FIG. 3 illustrates an array of periodic square grid patterns that may model a random pattern.

FIG. 3 shows multiple non-random patterns that may be used to model the random pattern of FIG. 2, in accordance with an embodiment of the invention. These non-random patterns are square grids containing various pitches (Pitch 1-5). In practice, these square grids are selected at discrete pitch intervals, and each pitch at discrete orientation angles, thereby sampling the full range of grid pitch and angular orientations.

Figure 4:
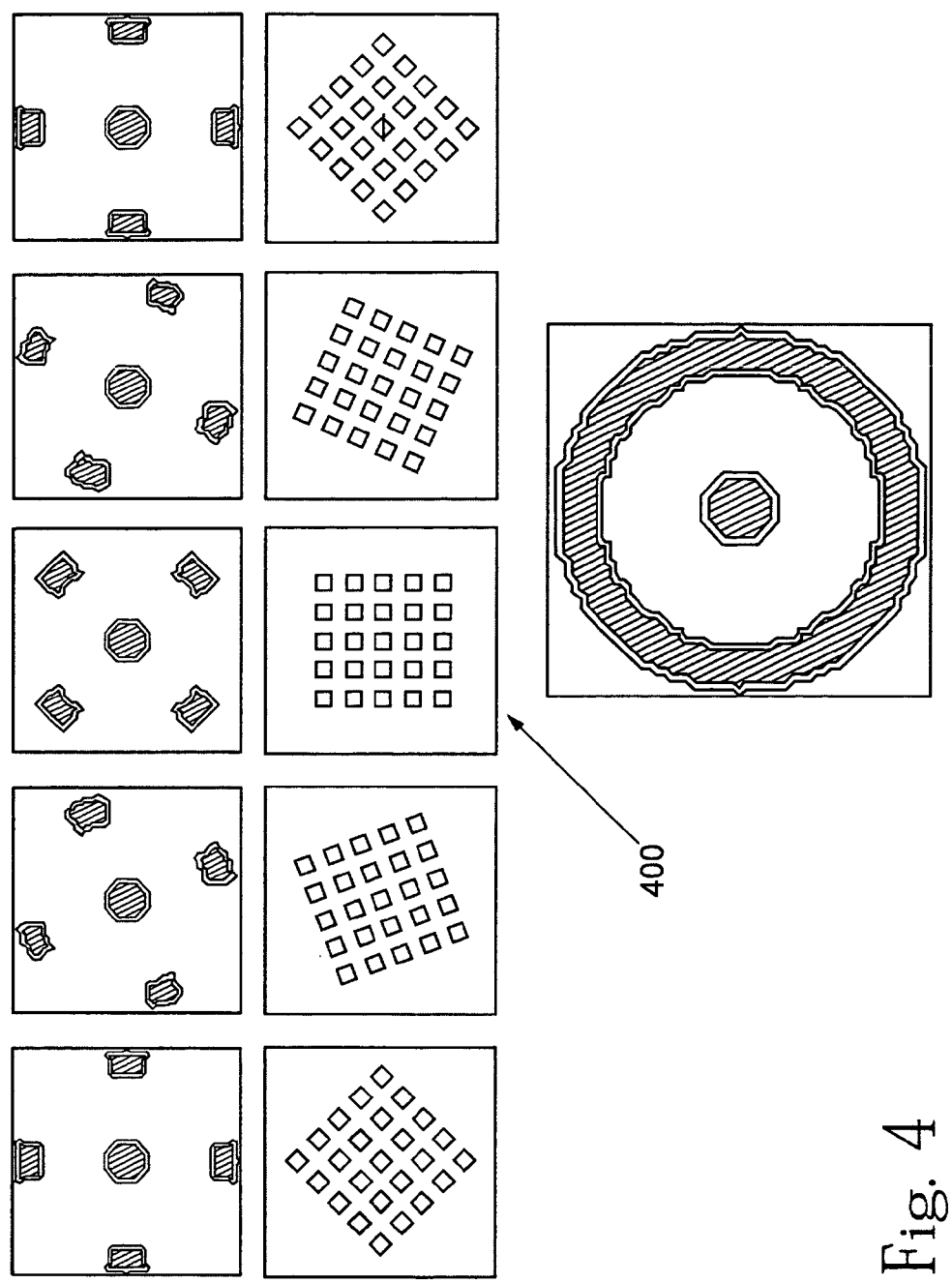
FIG. 4 illustrates several multipole illumination configurations (5 pole illumination configuration) that may be used to print a square hole grid at different rotational orientation and a "bullseye" illumination configuration that may be used to image all the depicted angular orientations of the contact hole grid.

FIG. 4 shows simulated illumination configuration optimization results for different grid orientations. More specifically, this figure shows several multipole illumination configurations (five pole illumination configurations) that may be used to successfully print a $k_1=0.4$ minimum pitch contact hole grid through a full range of pitches. In FIG. 4, each source shape corresponds to the optimum source shape for printing the square grid array 400 of 90 nm contact holes at the indicated angular orientation These illumination conditions correspond to a five pole illumination configuration, which includes an on-axis and an off-axis component. These illumination conditions have been calculated for an attenuated phase shift mask with a PROLITH 8.01 vector imaging simulation tool developed by KLA-Tencor. It will be appreciated that the method for configuring the illumination condition of random contact holes may be extended to any type of features.

Generally, lithographic simulations may be performed using different models. Examples of simulation models and methods to optimize a parameterized illumination configuration may be found, for example, in U.S. patent application Ser. No. 10/361,831, filed on Feb. 11, 2003, entitled "Method for Optimizing an Illumination Source Using Full Resist Simulation and Process Window Metric", and U.S. patent application Ser. No. 10/716,439, filed on Nov. 20, 2003, entitled "Lithographic Apparatus and Method for Optimizing an Illumination Source Using Isofocal Compensation". The contents of these two applications are incorporated herein in their entirety by reference.

In an embodiment, a lithographic simulation may be performed with an aerial image model in order to determine the incident radiation energy distribution onto the radiation sensitive material (resist). Calculation of the aerial image may be performed either in the scalar or vector form of the Fourier optics. Characteristics of the lithographic apparatus and process, like the numerical aperture (NA) or the specific pattern, may be entered as input parameters for the simulation. The quality of the aerial image may be determined by using a contrast or normalized aerial image log-slope (NILS) metric (normalized to the feature size). This value corresponds to the slope of the image intensity (or aerial image).

Relevant parameters to perform the aerial image simulation may include the distance from the focal plane of the Gaussian image plane, meaning the distance to the plane where the best plane of focus exists, as determined by geometrical ray optics, or the center wavelength of the quasi-monochromatic radiation source. The parameters may also include a measure of degree of spatial partial coherence of the illumination system, the numerical aperture of the projection system exposing the substrate, the aberrations of the optical system and a description of the spatial transmission function representing the pattern.

In another embodiment, a lithographic simulation may be performed with a resist model. In an implementation, the resist model may take into account, in the calculation of the critical dimension (or size) and its variation with variables such as dose/exposure energy and focus, the resist exposure, the resist baking and the resist developing. Likewise, the resist model may take into account, in an embodiment, a nonplanar topography and vector effects. The vector effects refer to the fact that an electromagnetic wave propagates obliquely when a high numerical aperture is used. Although vector effects can be accounted for when calculating the aerial image, a calculation of the vector effects in a low refractive index medium (e.g., in air) may greatly overestimate the contrast loss obtained on the substrate because the incident rays tend to be straightened when they propagate in the resist because of the resist's higher refractive index. Therefore, a resist model with a rigorous electromagnetic calculation may be desirable to accurately determine the actual experimental response.

Additional models like a lumped parameter model or a variable threshold resist model may also be used in other embodiments. It will be appreciated that the simulation model is selected because it matches experimental data.

Referring back to FIG. 4, when the contact hole grid is rotated through the full angular range the optimum illumination configuration naturally rotates with it. In order to successfully print the contact hole grid regardless of its orientation with a single illumination configuration, these rotated illumination configurations depicted in FIG. 4 may be summed/superposed. This single illumination, also referred to as a "bullseye" illumination configuration herein, includes an annular off-axis illumination component and a conventional on-axis illumination component. With this illumination configuration, complex patterns of contact holes may be imaged with sufficient latitude for manufacturing at minimum half pitches of $k_1=0.35$ or below. The bullseye illumination configuration treats all orientations equally though performance is generally compromised compared to oriented multipole illumination combined with oriented hole arrays. For a random pattern, the bullseye illumination configuration may present the best imaging solution, particularly using an attenuated phase shift mask.

Figure 5A:
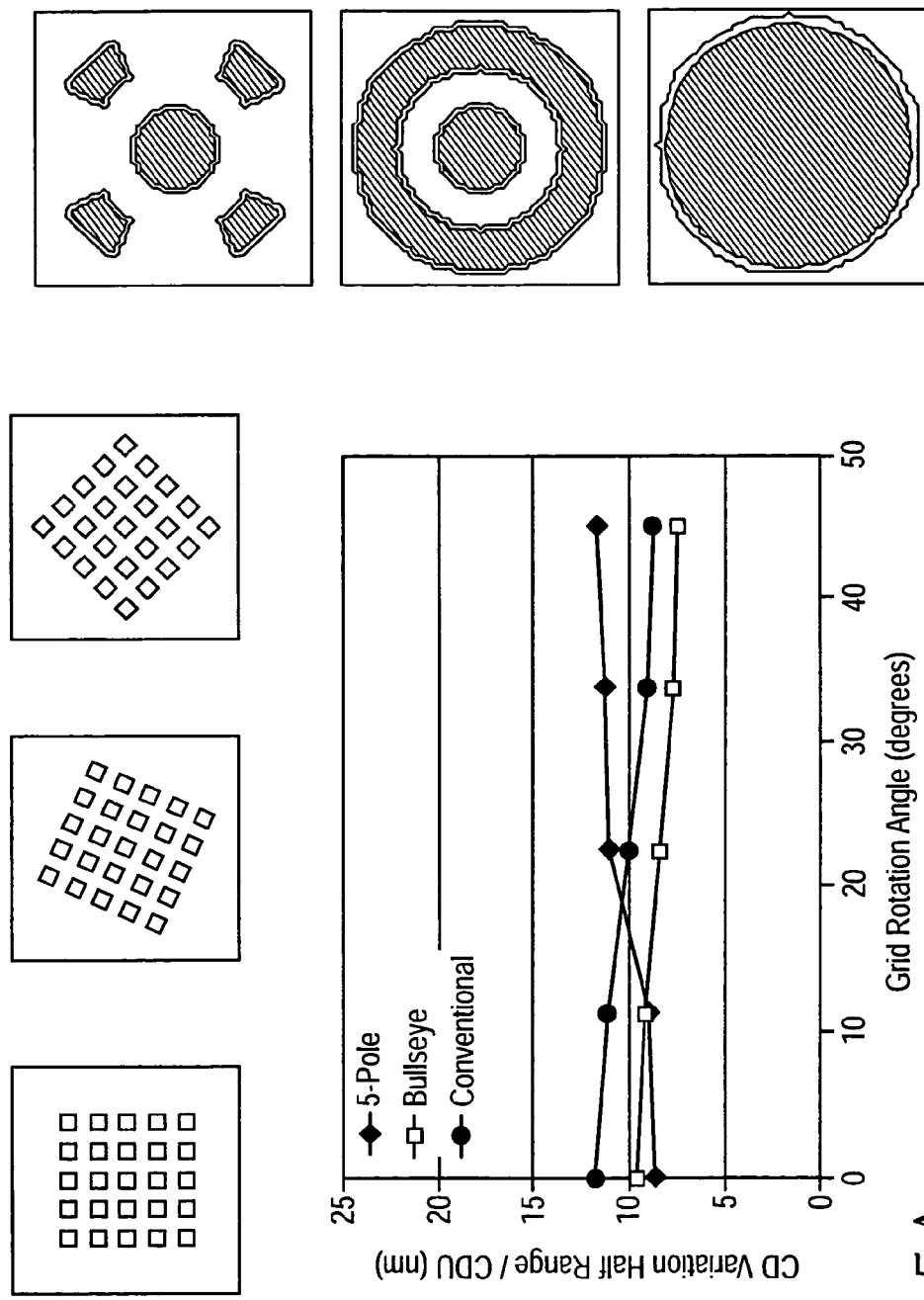
FIGS. 5a-b show two graphs representing the simulated critical dimension uniformity (CDU) half range variation as a function of hole grid rotation angle for various illumination configurations.
Figure 5B:
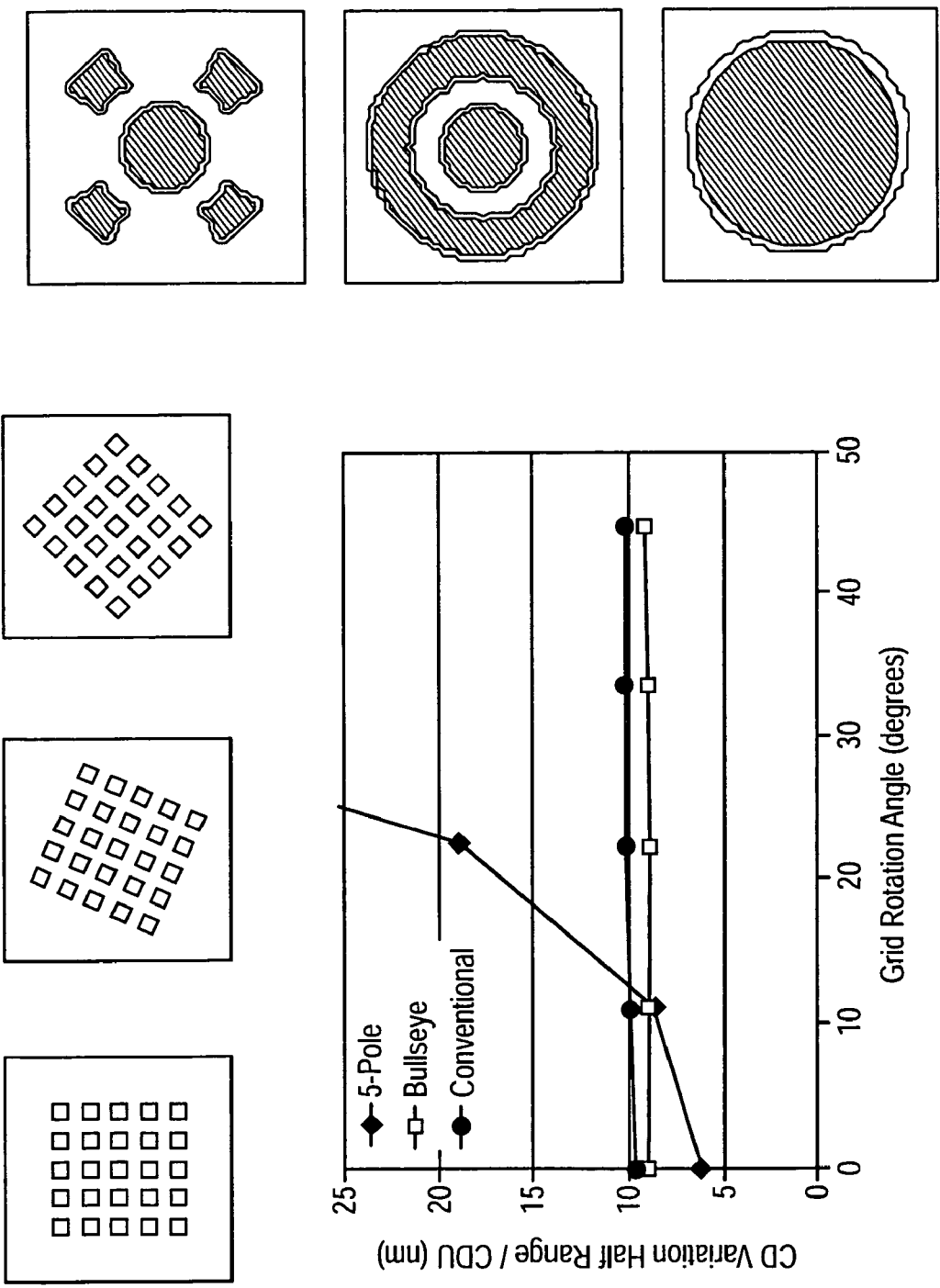

FIG. 5a-b shows two graphs representing the simulated variation of CD variation half range/CDU as a function of grid rotation angle for three different illumination configurations: a five pole illumination configuration, a bullseye illumination configuration and a conventional on-axis illumination configuration. In FIG. 5a, the five pole illumination configuration includes a conventional on-axis illumination having a 0.3 radius (normalized relative to the full illuminator aperture) and four off-axis poles arranged at ±45° with respect to the horizontal axis. These off-axis poles have a 0.6 inner radius and a 0.9 outer radius. The bullseye illumination configuration has annular illumination with a 0.6 inner radius and a 0.9 outer radius and conventional on-axis illumination having a 0.3 radius. The conventional on-axis illumination configuration has a 0.9 radius. In FIG. 5b, a more relaxed pitch is considered and simulation results are given for illumination configurations that are substantially similar to those of FIG. 5a. In FIG. 5b, the off-axis poles of the 5 pole illumination have a 0.52 inner radius and a 0.82 outer radius, and the radius of the conventional illumination is 0.77.

It will be appreciated that creation of these illumination configurations can be done with conventional beam shapers. U.S. Pat. No. 6,452,662 discloses, for example, a multimode generating element that could be used to generate these illumination configurations. The content of that application is incorporated herein in its entirety by reference. The multipole generating element, disclosed in that application, includes four triangular blades insertable into the beam path at the pupil plane of the illumination system. This multimode generating element enables continuously variable quadrupole illumination configurations to be produced. In another embodiment, a metal aperture plate filter could be used to create the desired illumination configuration.

FIG. 5a shows results obtained with a minimum contact hole pitch of 163.2 nm corresponding to $k_1$=0.38. FIG. 5b shows results obtained with a second contact hole pitch of 193 nm corresponding to $k_1$=0.45. The CD variation half range quantity used here approximates the CD variation three sigma value and is representative of contact hole CD variations as a result of several parameters, which may include dose, focus, mask error, lens aberrations, etc. CD variation half range will be referred to as critical dimension uniformity (CDU) in the remaining description. In the embodiment of FIGS. 5a-b, the CDU corresponds to the quadratic sum of CD variations due to dose, focus and mask errors. The grid is rotated over a 0°-45° range which spans all possible angular orientations due to the symmetry of the problem. Simulation parameters include a 90 nm hole size, a 0.9 numerical aperture (NA) and an optimization metric is used to minimize CD variation over a 0.15 μm focus, 2% dose and 2 nm mask CD error range. It will be appreciated that this range is typical of expected variations for a modern photolithographic process.

As can be seen in FIGS. 5a-b, symmetrical illumination configurations, such as the conventional and bullseye illumination configurations, are "flat" through angle. However, best results are obtained with a bullseye illumination configuration. For this type of illumination configuration, a CDU lower than 10 nm can be obtained regardless of the pitch and the grid rotation angle. By contrast, a multipole illumination configuration (e.g., a 5 pole illumination configuration), while angle insensitive at tight pitch, may be very sensitive, as pitch increases.

Figure 6A:
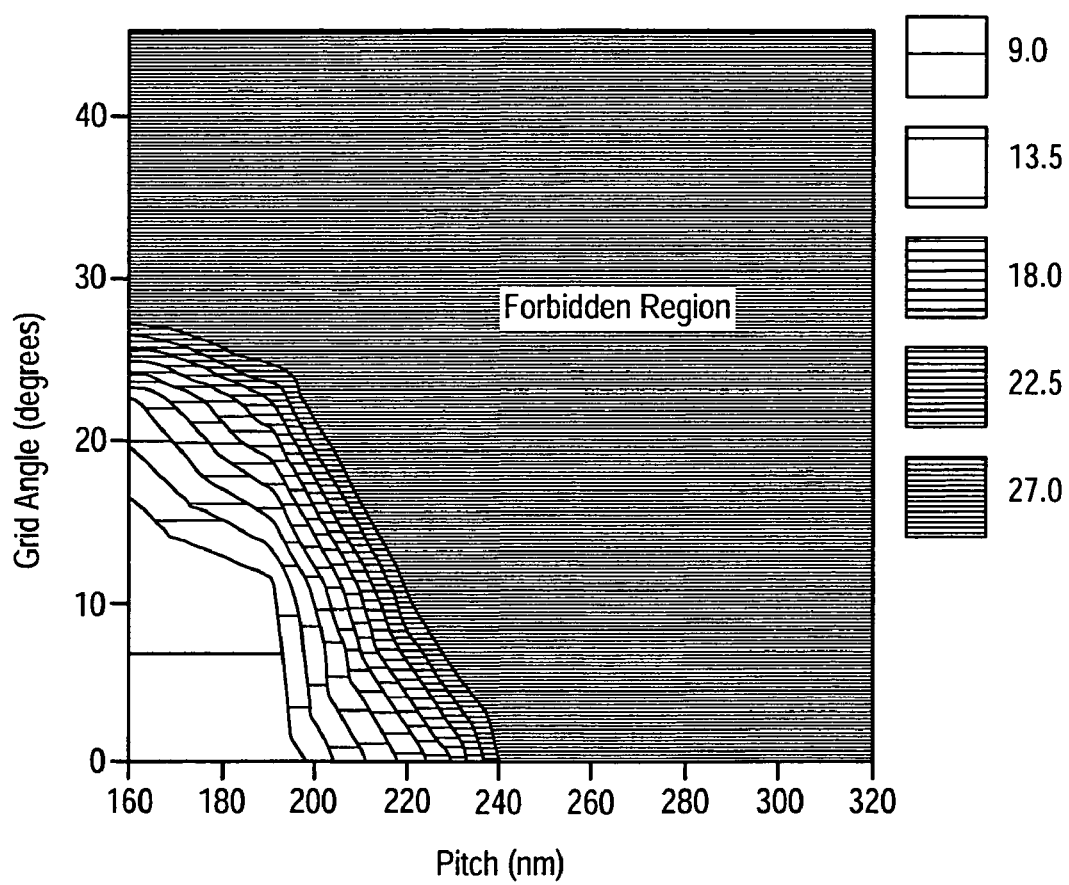
FIGS. 6a-b show simulated critical dimension uniformity (CDU) maps (grid angle vs. pitch) or two different illumination configurations.
Figure 6B:
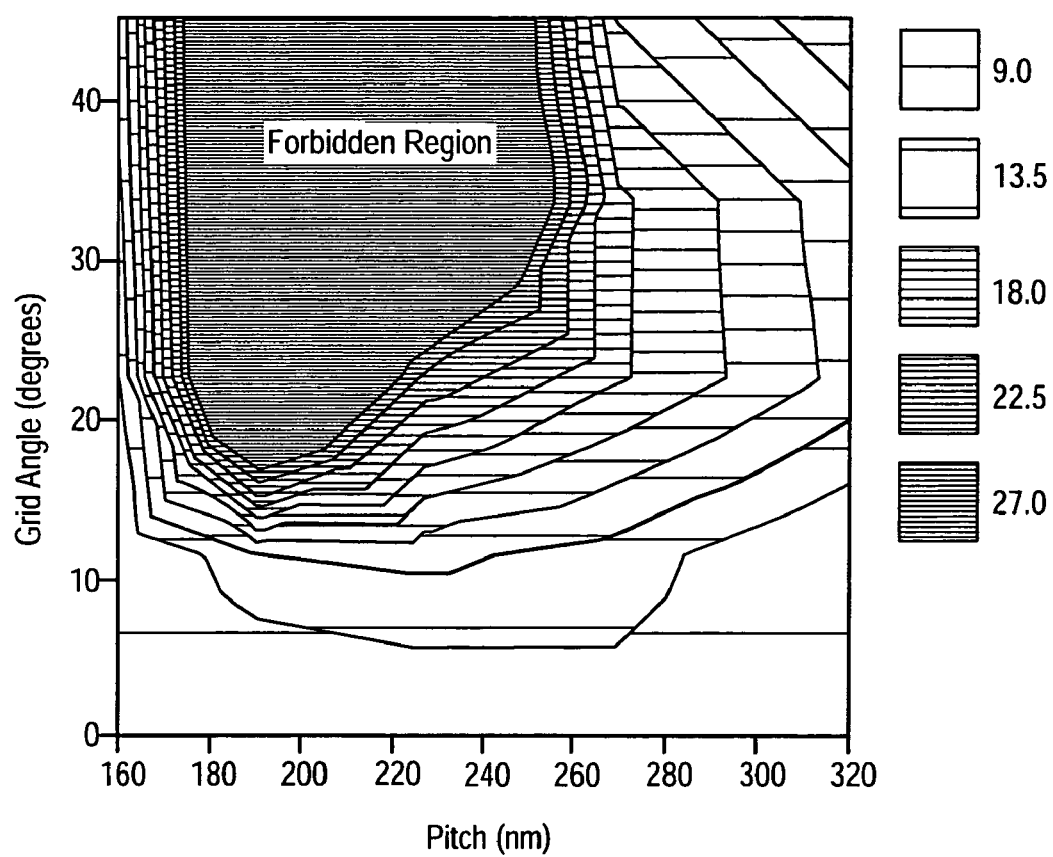
Figure 6C:
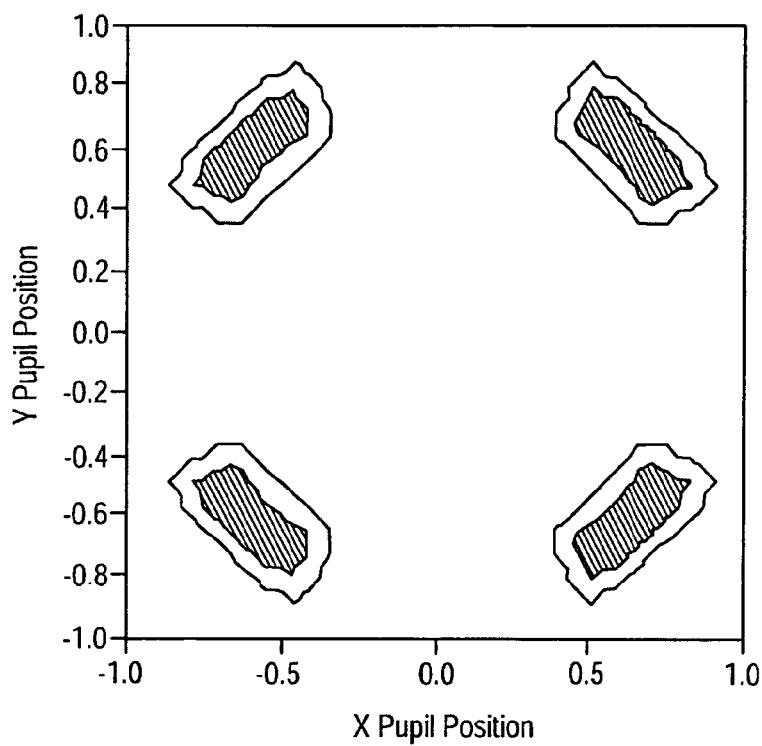
FIGS. 6c-d respectively show cross sections of the off-axis multipole and five pole illumination configurations used in FIGS. 6a-b.
Figure 6D:
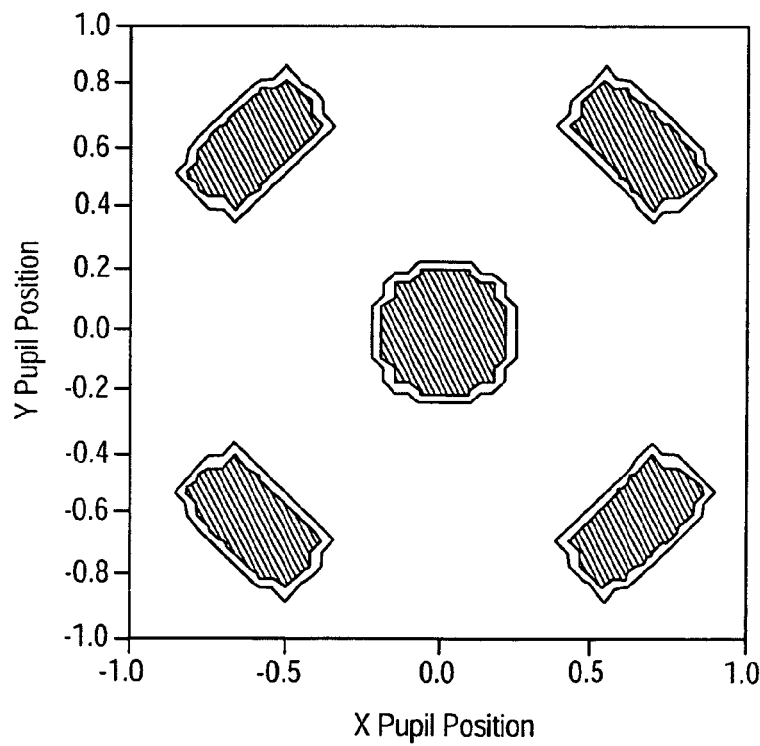

FIGS. 6a-b show simulated CDU maps (grid angle vs. pitch) obtained with a square grid pattern of 90 nm contact holes for two different illumination configurations corresponding to $k_1$=0.4 min. half pitch. These CDU maps are obtained by repeating the same type of calculations performed to generate the graphs in FIGS. 5a-b over a 160 nm-320 nm pitch range. In FIG. 6a, the CDU map is calculated for an off-axis multipole illumination configuration used with the pattern on a binary mask (BIM). In FIG. 6b, the CDU map is calculated for a five pole illumination configuration used with the pattern on a 6% attenuated phase shift mask. FIGS. 6c-d respectively show cross sections of the off-axis multipole and five pole illumination configurations. The off-axis multipole illumination configuration has an outer radius of 0.96 (relative to the pupil aperture), an inner radius of 0.76 and an opening angle of 30°. The five pole illumination configuration has a 0.23 radius center pole and off-axis poles having a 0.76 inner radius, a 1.0 outer radius, and an opening angle of 30°. Simulation parameters include a 0.9 numerical aperture (NA) and an optimization metric is used to minimize CD variation over a 0.15 μm focus, 2% dose and 2 nm mask CD error range.

FIG. 6a shows that the region giving desirable CDU results is very small. CDU values lower than 9 nm can only be obtained for a narrow pitch and rotation angle range of (160 nm-200 nm/0°-20°). Outside this zone, CDU results are undesirable, i.e. higher than 10%, for device manufacturing. FIG. 6b shows that a five pole illumination gives a good CDU through the full pitch range but only for grid angles from 0 to about 8°.

Figure 7A:
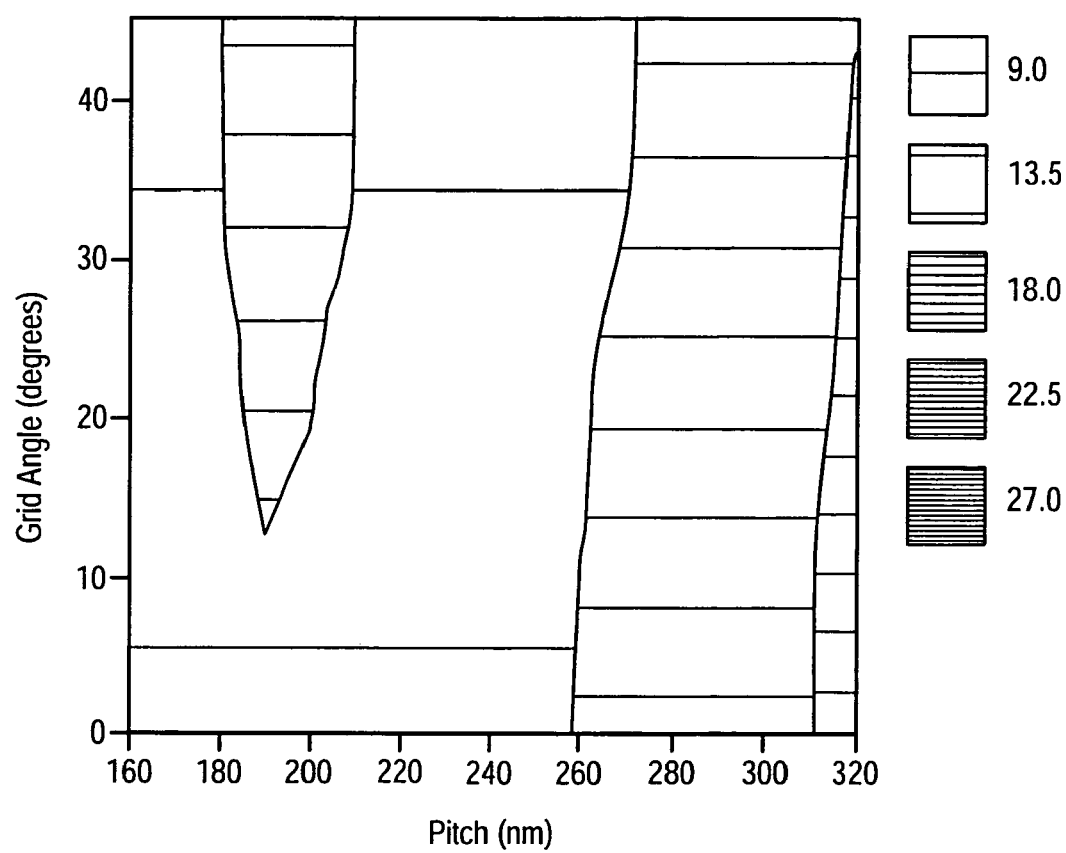
FIGS. 7a-b show simulated CDU maps for two different illumination configurations in accordance with an embodiment of the invention.
Figure 7B:
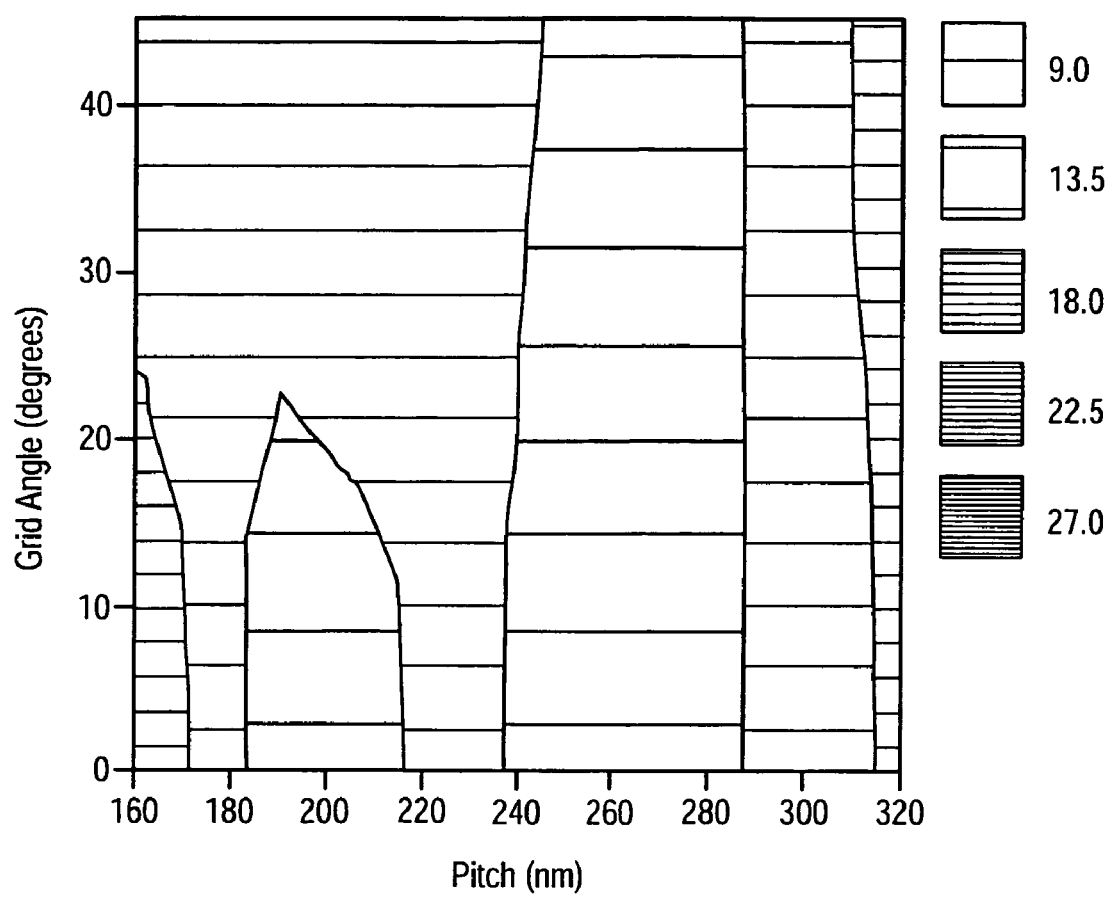
Figure 7C:
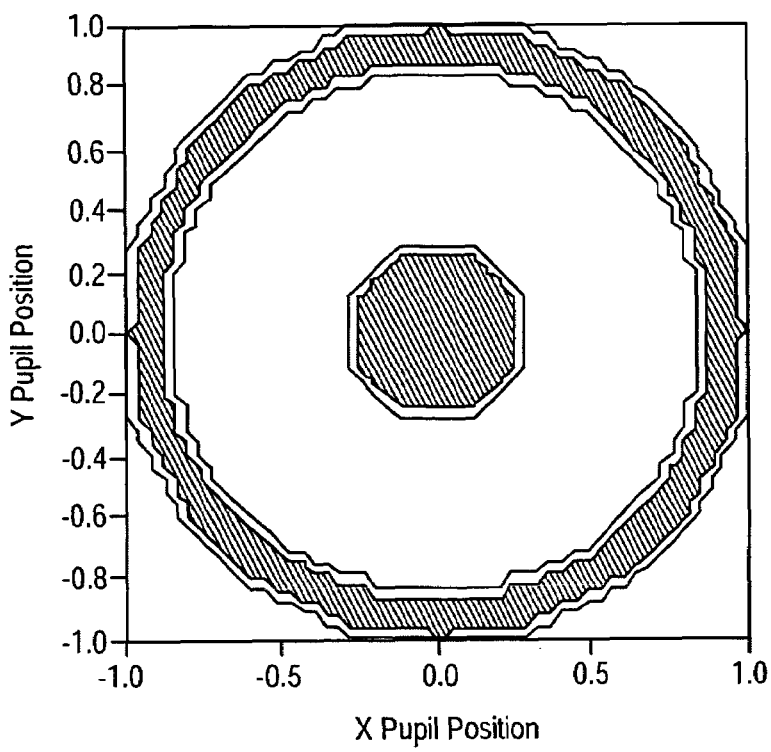
FIGS. 7c-d respectively show cross sections of the bullseye and conventional illumination configurations used in FIGS. 7a-b.
Figure 7D:
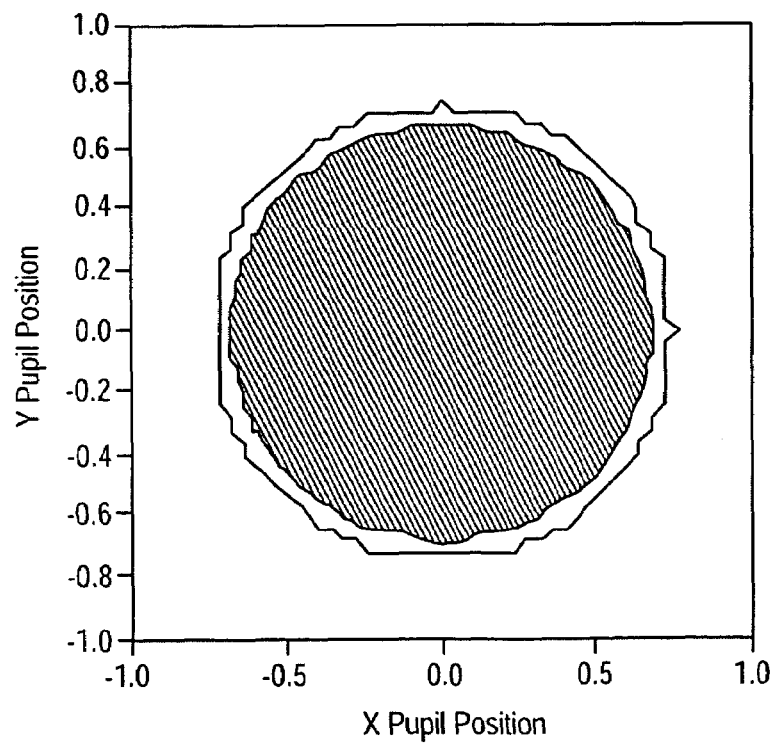

FIGS. 7a-b show simulated CDU maps (grid angle vs. pitch) obtained with a square grid of 90 nm contact holes for two different illuminations corresponding to $k_1$=0.4 min. half pitch, source and bias optimized. In FIG. 7a, the CDU map is calculated for a bullseye illumination configuration used with the pattern on a 6% attenuated phase shift mask. In FIG. 7b, the CDU map is calculated for a conventional on-axis illumination configuration having a 0.7 radius used with the pattern. These CDU maps are obtained by repeating the same type of calculations performed to generate the graphs in FIGS. 5a-b over a 160 nm-320 nm pitch range. FIGS. 7c-d respectively show cross sections of the bullseye and conventional illumination configurations. The bullseye illumination configuration has a 0.28 radius conventional illumination and an annular illumination having a 0.87 inner radius and a 1.0 outer radius. The conventional illumination configuration has a radius of 0.7. In both cases, calculation of the CDU maps is performed with lithographic simulation parameters that are similar to those identified in FIGS. 6a-b.

As can be seen in FIGS. 7a-b, CDU results are better for symmetrical illumination configurations, which corroborates the results of FIGS. 5a-b. For the bullseye illumination configuration, average CDU is 8.9 nm and the worst contact hole CDU was 11.7 nm. For the convention illumination configuration, average CDU is 12.2 nm and the worst contact hole CDU was 15.7 nm. However, superior results may be obtained with a bullseye illumination configuration compared to, for example, a conventional illumination configuration as shown in FIG. 7d. For the bullseye illumination configuration, good CDU results (i.e. lower than about 10%) can be obtained through a full range of pitches and grid angles.

The illumination configurations shown in FIGS. 7a-b may be tested with a random contact hole pattern to determine whether similar CDU results can also be obtained. Table 1 and Table 2 illustrate CDU (CDU average and CDU max) results obtained by simulation with selected contact holes (1-9) of the random pattern shown in FIG. 8a. In these tables, the bullseye illumination configuration of FIG. 7c is compared to the conventional illumination configuration of FIG. 7d. These CDU results are compared to CDU results obtained with a contact hole grid through pitch and angle.

In both scenarios, the random pattern is the same. It includes a pattern of 90 nm contact holes and a 171 nm minimum pitch. Calculations are performed with a 0.9 numerical aperture ($k_1$=0.4) and a 6% attenuated phase shift mask (without any assist features). A horizontal and vertical contact hole bias is applied but the global bias (i.e. CD difference between the contact hole size on the mask and the target size) and the dose conditions are the same as those used in the foregoing embodiments. It will be appreciated that appropriate hole biasing, combined with appropriate illumination, allows complex hole patterns to be printed with relatively high depth of focus and low mask error enhancement factor (MEEF) without placing a high density of complex assist features on the mask. Calculations are also performed with an optimization metric that minimizes CD variations over a 0.15 μm focus, 2% dose and 2 nm mask CD error range.

Tables 1 and 2 show the average and maximum CDU for a random contact hole pattern and a rotated contact hole grid. Results in Table 1 are obtained with the illumination configuration of FIG. 7c (i.e., a bullseye illumination configuration including a 0.28 radius conventional illumination and an annular illumination having a 0.87 inner radius and a 1.0 outer radius). Results in Table 2 are obtained with the illumination configuration of FIG. 7d (i.e. a conventional sigma illumination having a radius of 0.7).

TABLE 1

| | CDU average (nm) | CDU max (nm) |
|---|---|---|
| Random pattern | 10.3 | 12.1 |
| Grid through pitch and angle | 8.9 | 11.7 |

TABLE 2

| | CDU average (nm) | CDU max (nm) |
|---|---|---|
| Random pattern | 13.5 | 15.3 |
| Grid through pitch and angle | 12.2 | 15.7 |

Figure 8B:
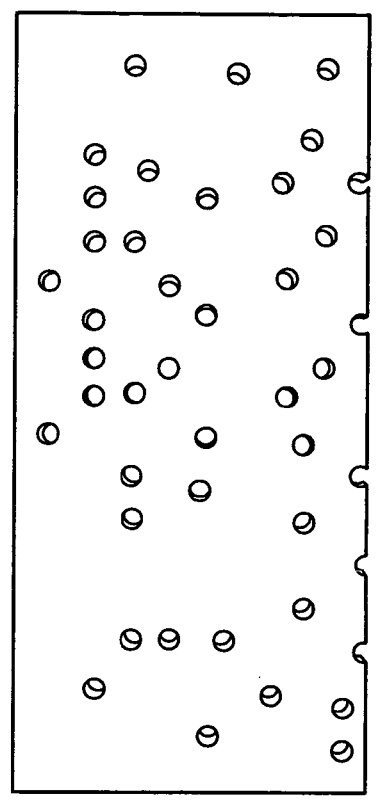
FIGS. 8b-c respectively show the simulated printed random patterns obtained with the illumination configurations of FIGS. 7c and 7d.
Figure 8A:
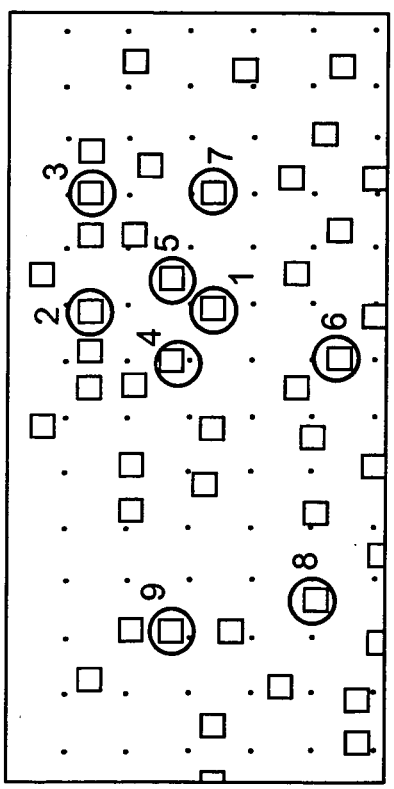
FIG. 8a shows the schematic random pattern used to calculate the CDU in Table 1 and Table 2.
Figure 8C:
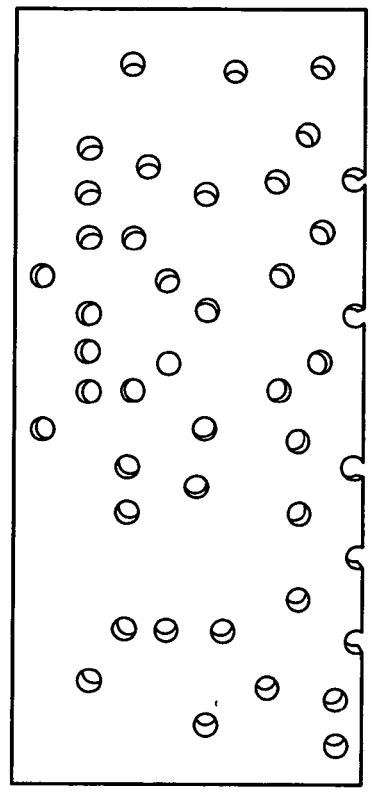

Tables 1 and 2 show that the average and maximum CDU values of the random contact hole pattern are substantially similar to the average and maximum CDU values of a rotated contact hole grid. These results show that CDU values obtained with a contact hole grid through pitch and angle are good indicators of CDU values that would be obtained with a random contact hole pattern (although they do not necessarily predict the ease of OPC). These results also show that a contact hole grid through pitch and angle approach can be used to predict behaviors of random contact hole patterns, which are generally difficult to simulate. A comparison of the results of Table 1 and Table 2 also indicates that a bullseye illumination configuration provides a better CDU result for a random contact hole pattern. Simulations of the resulting photoresist patterns printed on a substrate for both illumination configurations are shown in FIGS. 8b-c.

Figure 9A:
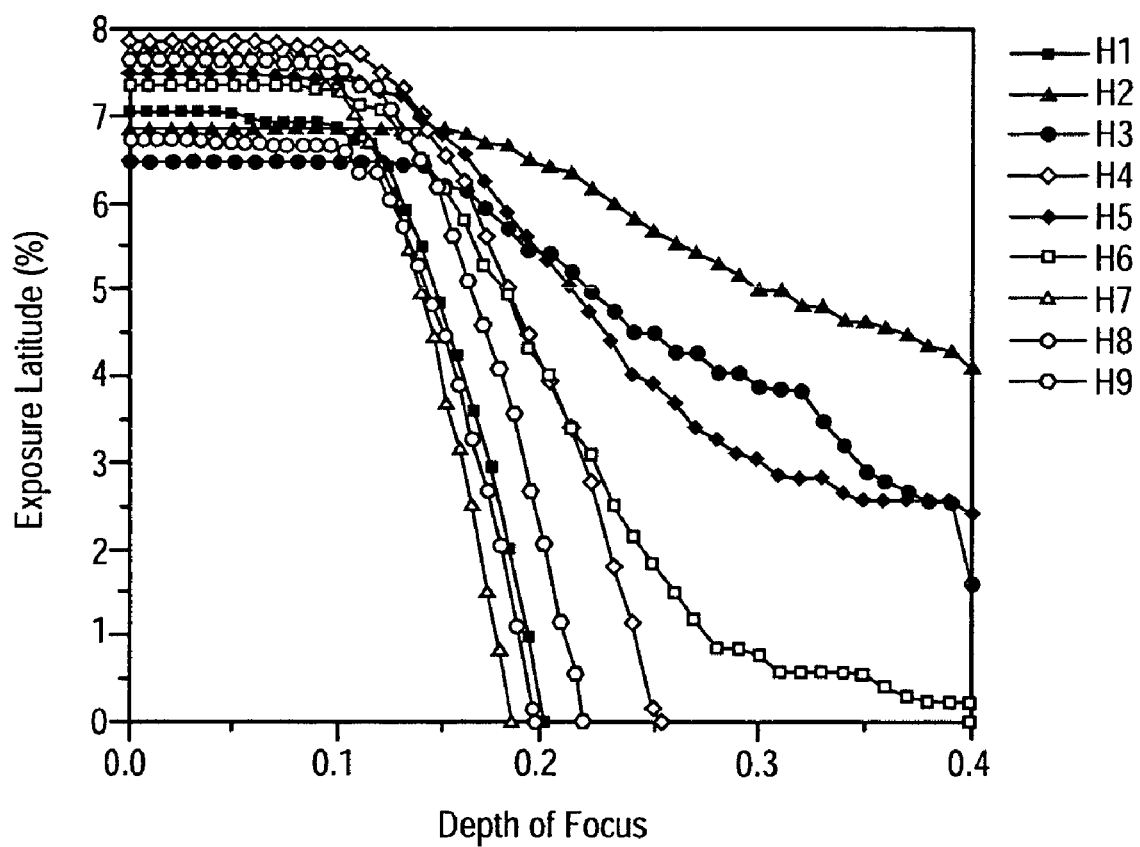
FIG. 9a shows the simulated variation of exposure latitude as a function of depth of focus for specific pattern holes illuminated with the bullseye illumination configuration of FIG. 7c.
Figure 9B:
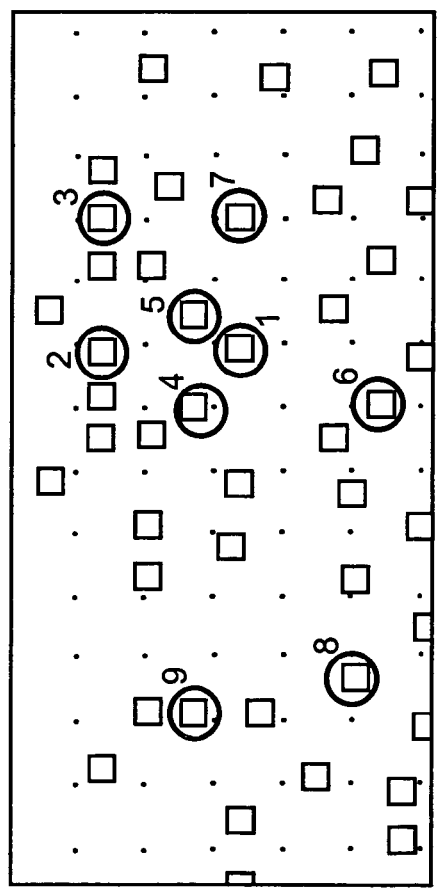
Figure 9C:
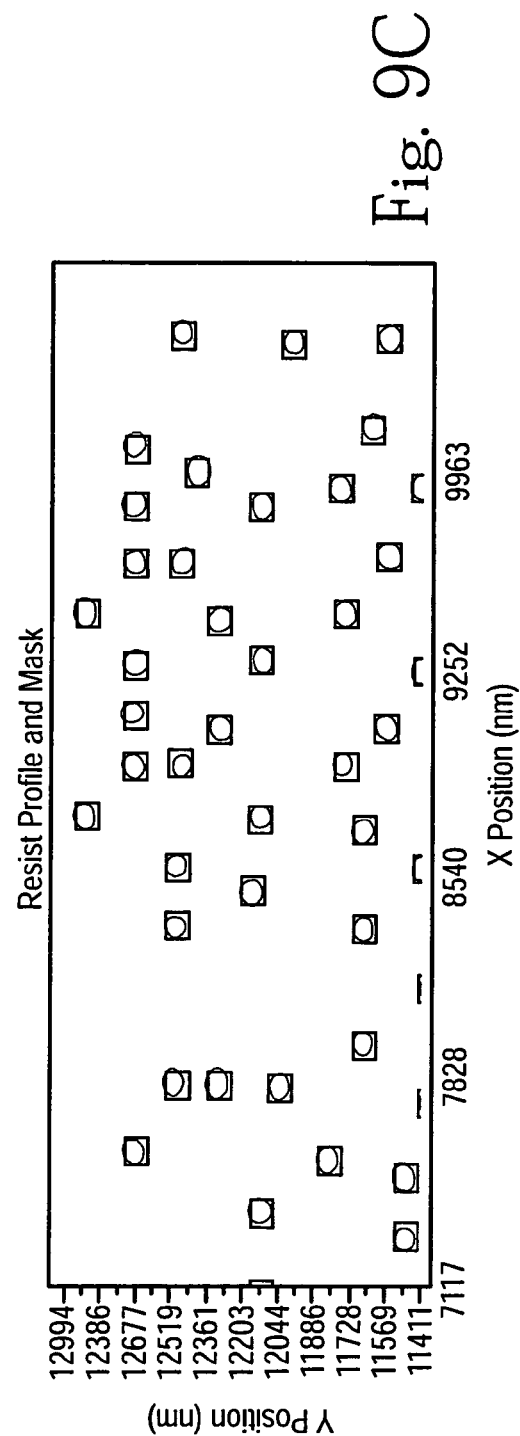
FIG. 9c shows the schematic shape of the contact holes of the pattern and the simulated shape of the contact holes formed in the photoresist.

FIG. 9a shows the simulated variation of exposure latitude as a function of depth of focus for selected pattern holes of the random hole pattern shown in FIG. 9b. Calculations are performed for the bullseye illumination configuration of FIG. 7c. The characteristics of the pattern in terms of hole CD and pitch are unchanged. The minimum pitch is 171 nm and a 6% attenuated phase shift mask is used. Illumination conditions are the same as those previously shown and NA is 0.9. The process window calculation assumes an allowable CD error of ±10%. Results are given for the horizontal measurement of the selected contact holes. FIG. 9a shows that a depth of focus greater than about 0.18 μm and an exposure latitude between about 7% and 8% can be obtained for all of the selected points in the random pattern. FIG. 9c shows a superposition of the random layout of the mask and the simulated printed hole pattern of contact holes (square contact holes) and the simulated resist profile obtained with the bullseye illumination configuration.

Figure 10A:
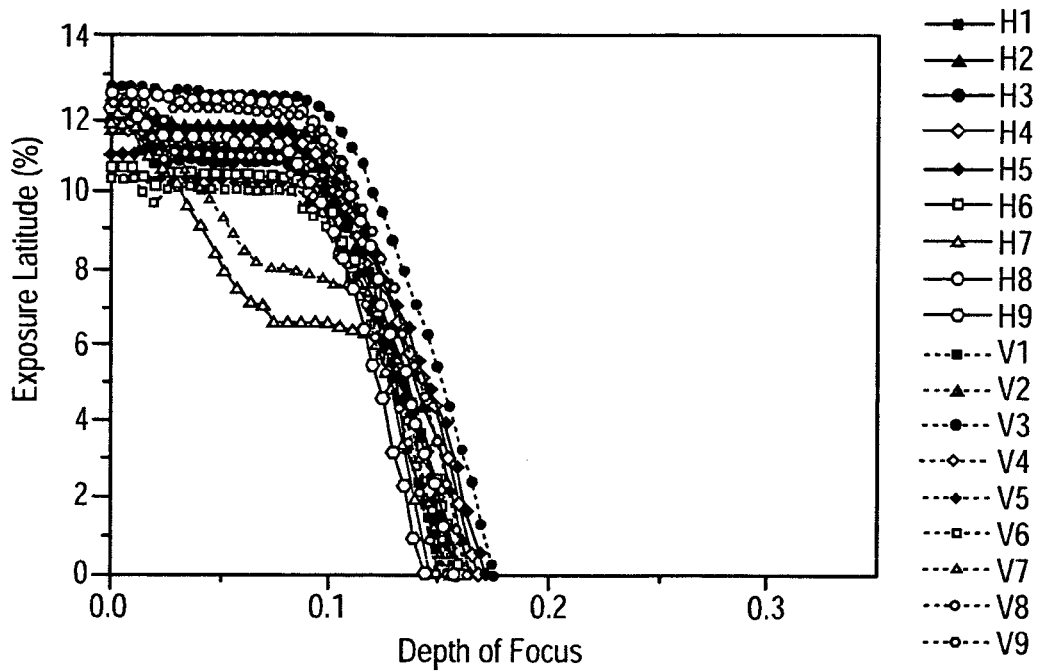
FIGS. 10a-b show respectively the simulated variation of exposure latitude as a function of depth of focus for specific pattern holes of a random pattern with a dry exposure and with an immersion exposure.
Figure 10B:
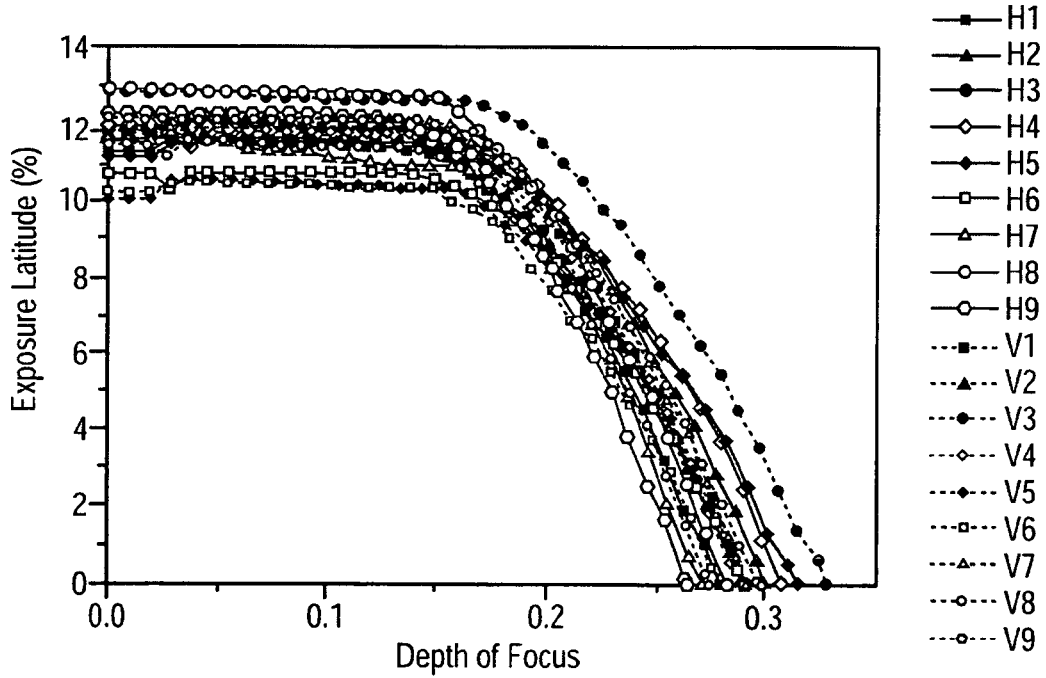

Depth of focus and exposure latitude results may be further enhanced with the use of an immersion lithography exposure technique. For example, FIGS. 10a-b show respectively the simulated variation of exposure latitude as a function of depth of focus for selected contact holes (1-9) of the random pattern shown in FIG. 10c with dry exposure (FIG. 10a) and liquid water immersion exposure ($k_1$=0.4) (FIG. 10b). The numerical aperture NA is 0.9 and conventional illumination with σ=0.7 is used in both calculations. Simulations are performed for the conventional illumination configuration shown in FIG. 7d and for the horizontal and vertical components of each contact hole. A comparison of FIGS. 10a and 10b indicates that an immersion process substantially enhances the depth of focus. Table 3 is a table showing simulated CDU results obtained with dry and immersion exposure. CDU results shown in Table 3 indicate that for the same NA, an immersion process improves the lithographic process, giving higher depth of focus and lower CD variation.

TABLE 3

| | CDU average (nm) | CDU max (nm) |
|---|---|---|
| Dry | 13.5 | 15.3 |
| Immersion | 8.1 | 10.4 |

Immersion exposure clearly may extend lithographic processes to lower k

Figure 10C:
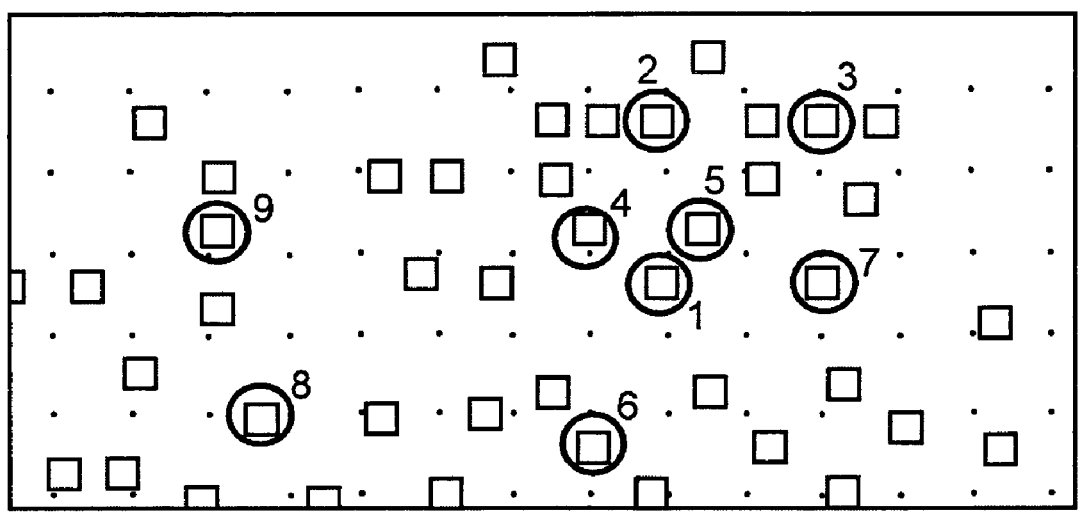
FIG. 10c shows the schematic random pattern used in FIGS. 10a-b.
Figure 11A:
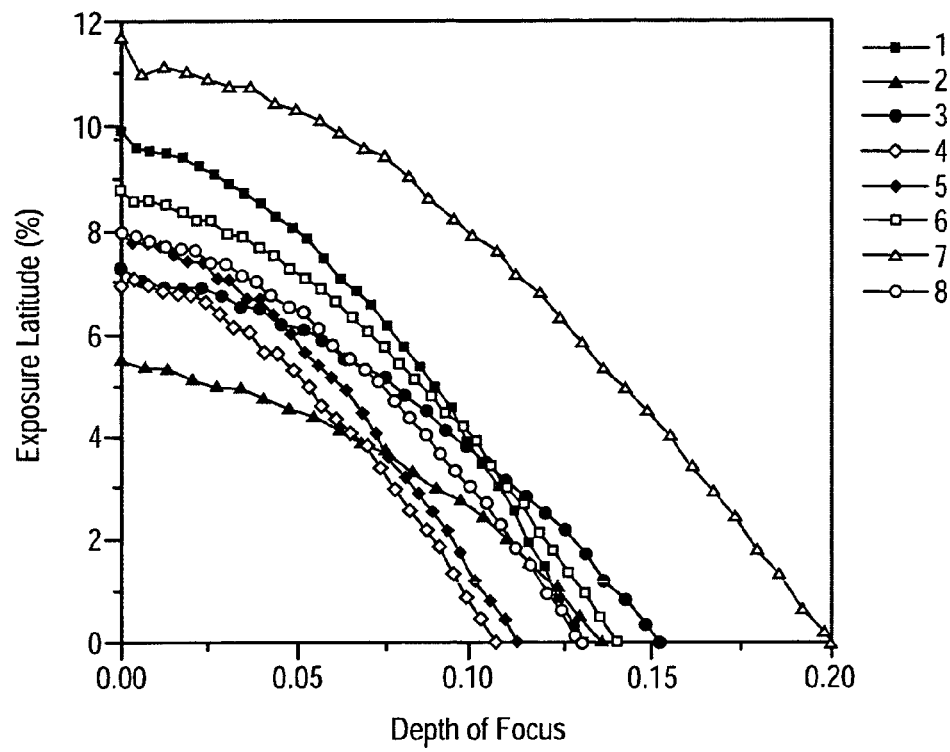
FIG. 11a shows the simulated variation of exposure latitude as a function of depth of focus for a random pattern on an IML/CPL (interference mapping/chromeless phase lithography) mask illuminated with a multipole illumination configuration.
Figure 11B:
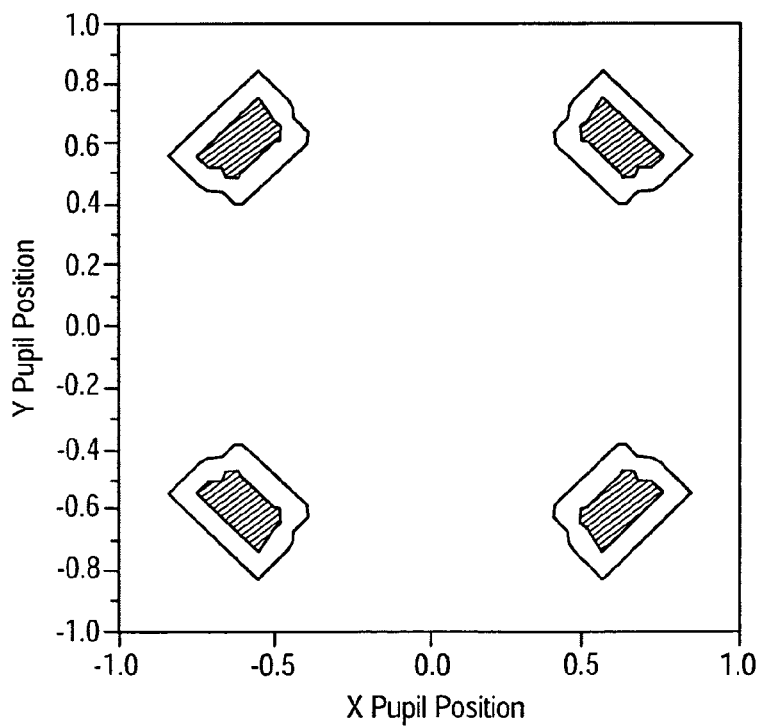

Referring now to FIG. 11a, the simulated variation of exposure latitude as a function of depth of focus for contact hole Nos. 1-8 of FIG. 10c is depicted. The contact hole size has been reduced from 90 nm to 75 nm and the minimum pitch to 144 nm. The random pattern is the same as that shown in FIG. 10c. This random contact hole pattern is exposed with the off-axis multipole illumination configuration shown in FIG. 11b. The off-axis poles have a 0.96 outer radius, a 0.76 inner radius and an opening angle of 20°. Calculations are performed assuming an interference mapping/chromeless phase lithography (IML/CPL) mask, and a 0.93 NA liquid water immersion exposure process. Interference mapping techniques produce optimized binary masks containing both 0° and 180° phase assist slots for use with off-axis illumination. This technique can be used to enhance both the exposure latitude and the depth of focus. As can be seen in FIG. 11a, the depth of focus for the selected contact holes of FIG. 10c is in the range from about 0.1 μm to about 0.2 μm, and the exposure latitude from about 6 to 12%. The mask error enhancement factor (MEEF) obtained with this process is in the 3.2-5.8 range, which is reasonably low for this difficult pattern and k1. MEEF corresponds to the incremental change in the final feature size on the substrate per unit change in the corresponding pattern feature size (where the pattern dimension is scaled to substrate size by the reduction ratio of the imaging apparatus). Near the resolution limit of a lithographic apparatus, the MEEF often rises dramatically. The minimum exposure latitude achieved was about 5.5% and the minimum depth of focus was about 0.11 µm. The simulation results showed printed contact holes that were well defined.

Figure 12A:
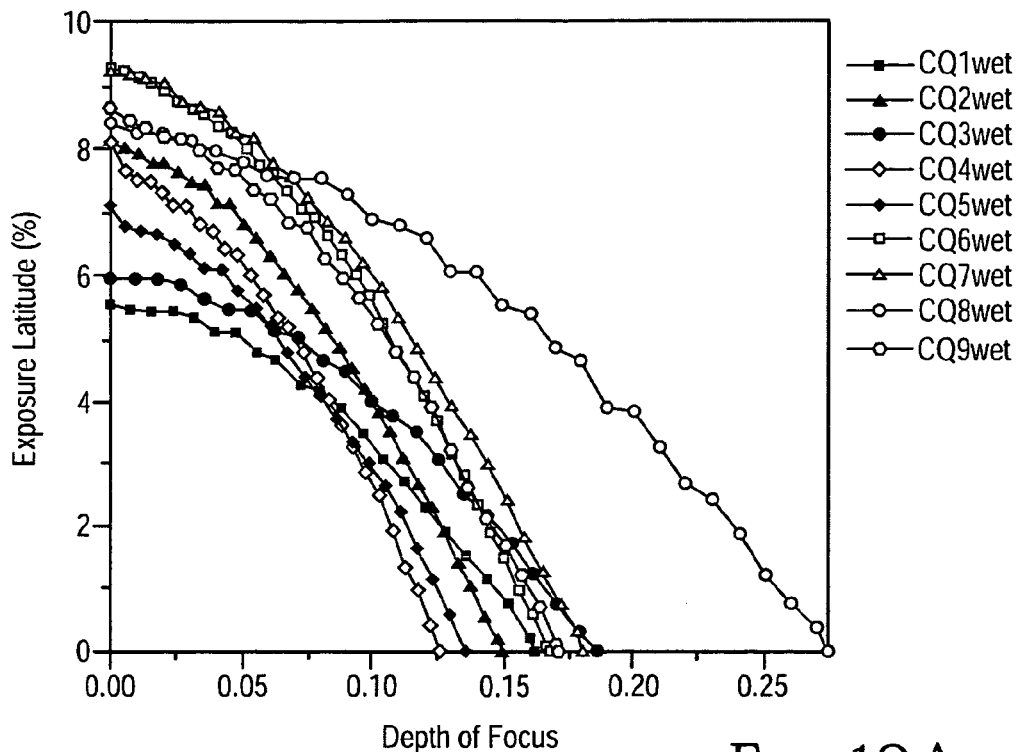
FIG. 12a illustrates the simulated variation of exposure latitude as a function of depth of focus for a random pattern on an IML/CPL (interference mapping/chromeless phase lithography) mask illuminated with a multipole illumination configuration.
Figure 12B:
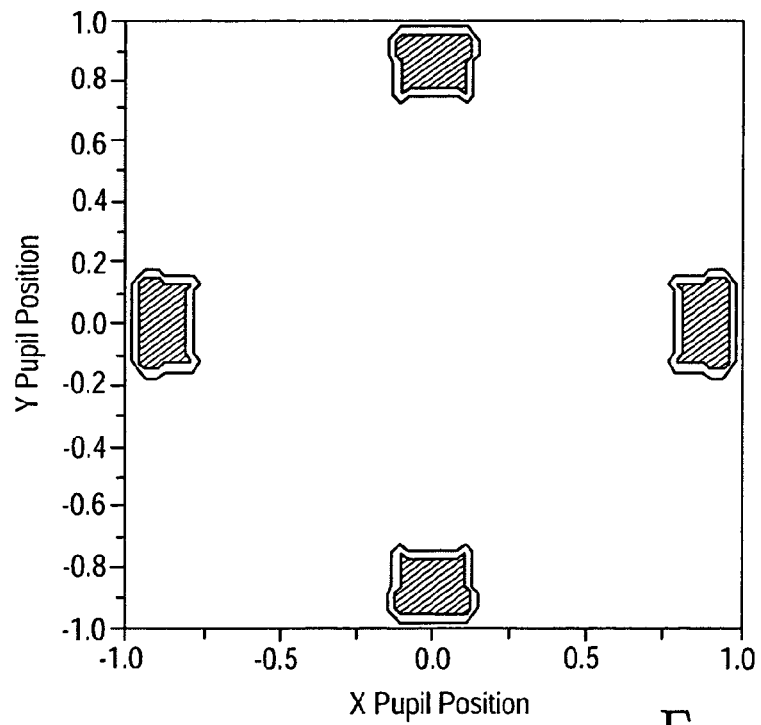

The results of similar simulation calculations for the off-axis multipole illumination configuration shown in FIG. 12b using an IML/CPL mask are shown in FIG. 12a. FIG. 12a represents the simulated variation of exposure latitude as a function of depth of focus for contact hole nos. 1-9 of the random pattern of FIG. 10c using a 0.93 NA liquid water immersion exposure process. These contact holes are illuminated with the off-axis multipole (CQuad type) illumination configuration shown in FIG. 12b. The size of the off-axis poles is the same as that of FIG. 11b, i.e., these poles have a 0.96 outer radius, a 0.76 inner radius and an opening angle of about 20°. These poles are, however, positioned differently (X and Y axis). Results indicate that there is less hole integrity, i.e. more undesirable shape variation and hole merging than with the illumination configuration shown in FIG. 11a. The minimum exposure latitude was about 5.5% and the minimum depth of focus was about 0.12 µm.

Figure 13A:
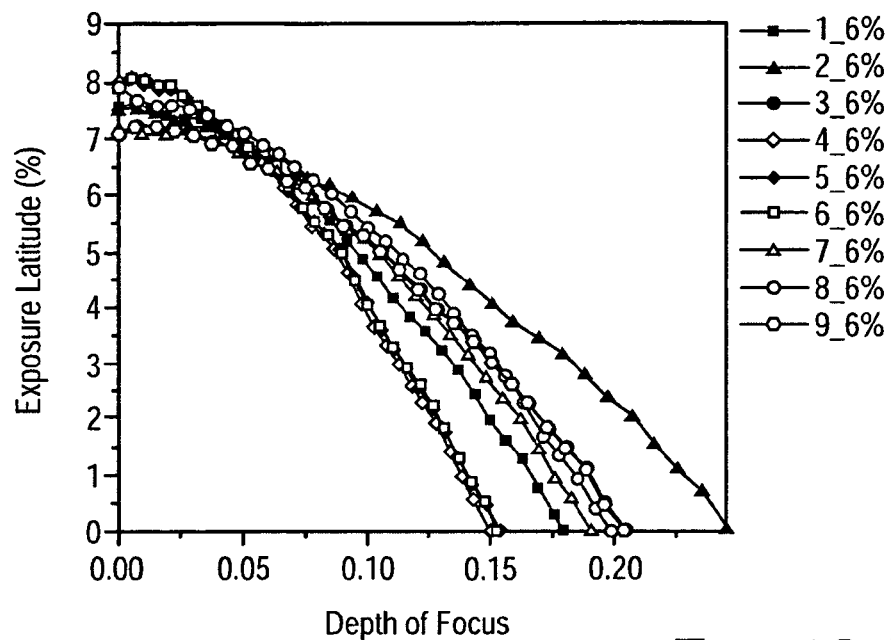
FIG. 13a illustrates the simulated variation of exposure latitude as a function of depth of focus for the random pattern of FIG. 10c (on a 6% attenuated phase shift mask) illuminated with a bullseye illumination configuration according to an embodiment of the invention.
Figure 13B:
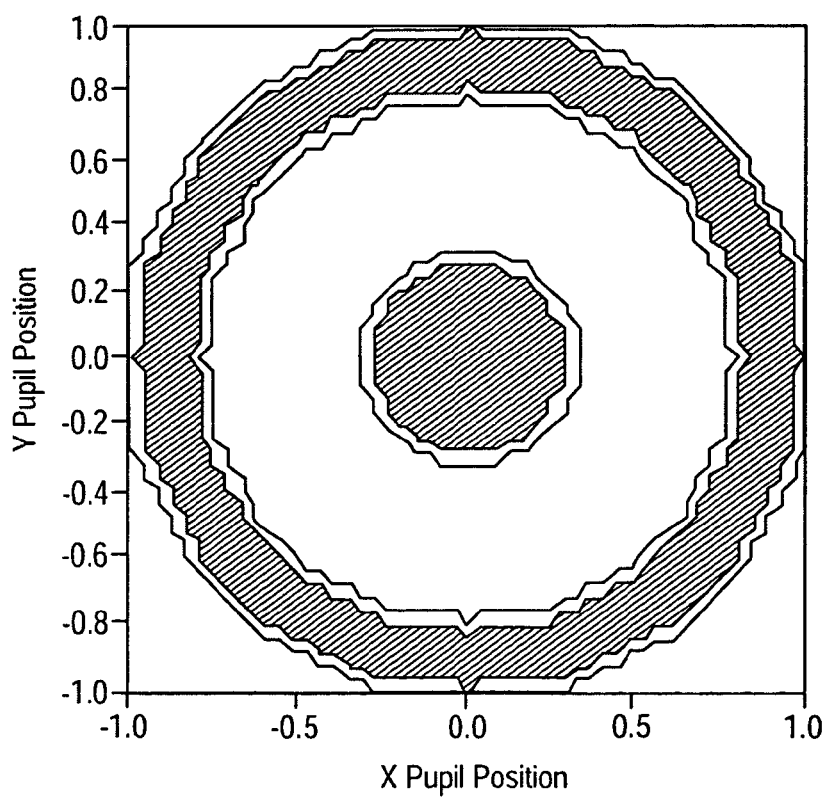

FIG. 13a illustrates the simulated variation of exposure latitude as a function of depth of focus for a random contact hole pattern illuminated with a bullseye illumination configuration (0.3 radius conventional illumination and 0.8 inner radius/1.0 outer radius annular illumination), as shown in FIG. 13b.Calculations are performed with a 6% attenuated phase shift mask and a 35 nm mask bias. Table 4 shows the size of the contact holes as measured on the mask compared to the printed contact hole size (in the photoresist) for selected holes of the random pattern used for FIG. 13a. Table 4 also shows the dose to size value E1:1 for a CD of 74.9911.

TABLE 4

| Mask size | CD | E1:1 |
|---|---|---|
|  | 74.9911 | 37.33 |
| 104.10 | 75.02526 |  |
| 112.47 | 75.05898 |  |
| 110.10 | 74.9848 |  |
| 109.83 | 75.04356 |  |
| 111.38 | 74.91046 |  |
| 109.57 | 74.84883 |  |
| 110.14 | 74.94553 |  |
| 111.82 | 74.9547 |  |

Results are given for a 0.93 NA immersion lithographic exposure process for the contact hole nos. 1-9 of FIG. 10c. As can be seen in FIG. 13a, a minimum depth of focus of about 0.15 µm and a minimum exposure latitude of about 6% can be obtained with this process. It is also possible to obtain MEEF values of about 4.5-5.7, which are reasonably low.

Figure 14A:
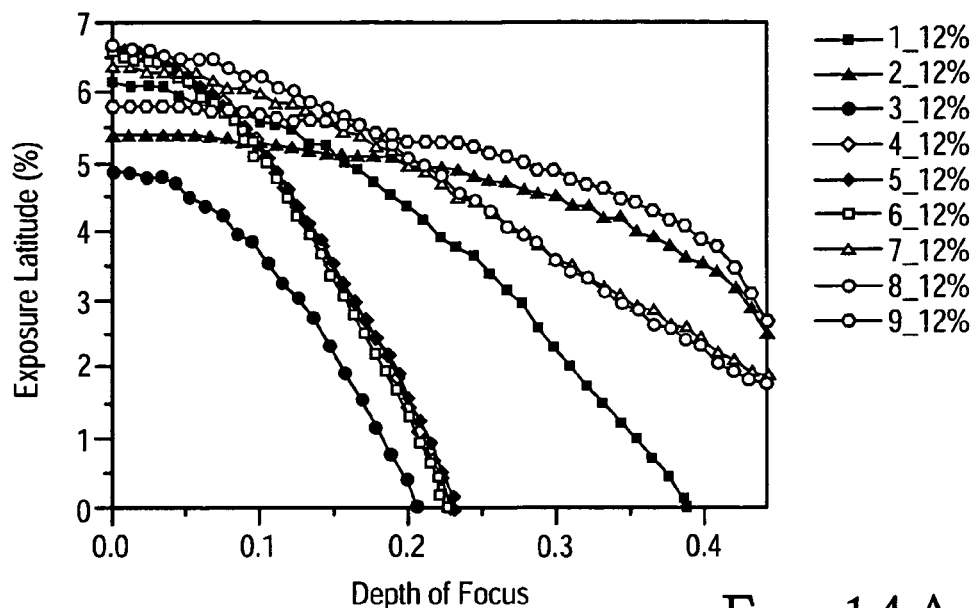
FIG. 14a shows the simulated variation of exposure latitude as a function of depth of focus for the random pattern of FIG. 10c (on a 12% attenuated phase shift mask) illuminated with a bullseye illumination configuration according to an embodiment of the invention.
Figure 14B:
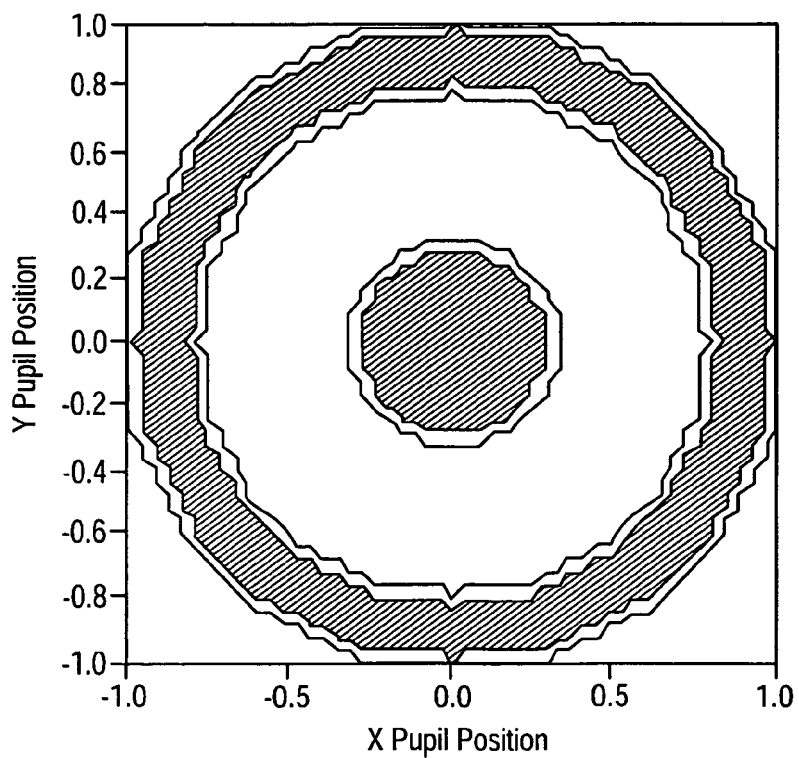

Calculations similar to those of FIG. 13a were performed with a 12% attenuated phase shift mask. FIG. 14a shows the simulated exposure latitude as a function of depth of focus for the same random contact hole pattern illuminated with the bullseye illumination configuration of FIG. 14b. This bullseye illumination configuration of FIG. 14b includes 0.35 radius conventional illumination and annular illumination having a 0.8 inner radius and a 1.0 outer radius. Calculations are also performed with a 35 nm mask bias and 0.93 NA liquid water immersion exposure process. Table 5 shows the size of the contact holes as measured on the mask compared to the printed contact hole size (in the photoresist) for selected holes of the random pattern used for FIG. 14a.Table 5 also shows the dose to size value E1:1 for a CD of 75.01126.

TABLE 5

| Mask size | CD | E1:1 |
|---|---|---|
|  | 75.01126 | 40.83 |
| 104.64 | 75.27369 |  |
| 113.40 | 74.94029 |  |
| 110.47 | 75.2674 |  |
| 110.00 | 74.89674 |  |
| 111.58 | 75.00452 |  |
| 109.17 | 74.83958 |  |
| 109.94 | 74.9884 |  |
| 111.09 | 75.10445 |  |

Results are given for the same contact holes previously identified. As can be seen in FIG. 14a, the combination of a 12% attenuated phase shift mask and the bullseye illumination configuration may greatly enhance the depth of focus. The minimum exposure latitude was about 5%, the minimum depth of focus was about 0.2 µm, and the MEEF was in the range of about 5.7-7.9. Though the process window is more favorable than for the 6% Att-PSM case, the tendency for densely located holes to merge is greater and hence OPC may be more difficult.

Figure 15A:
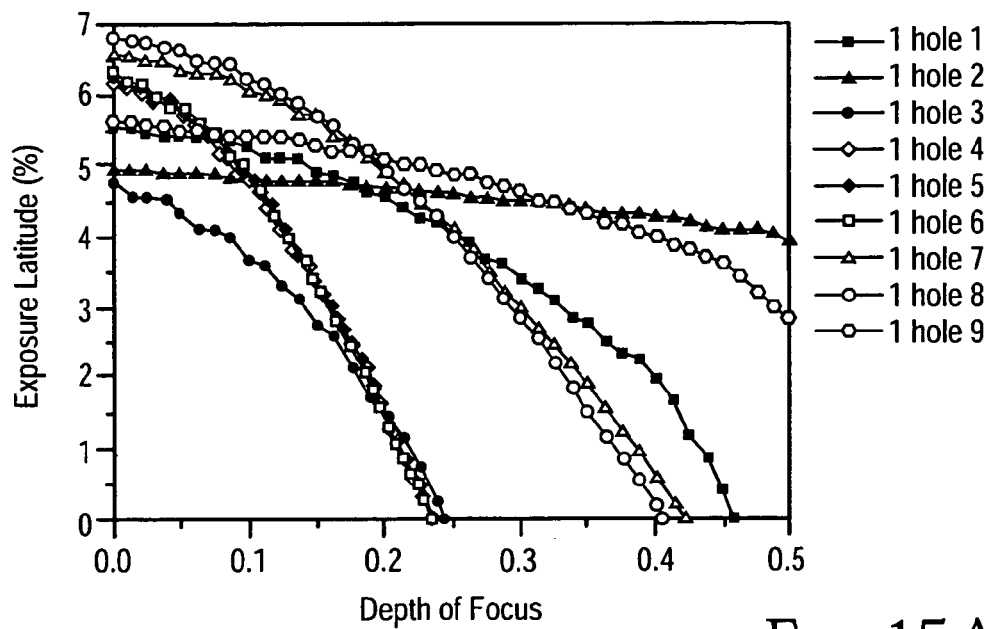
FIG. 15a shows the simulated variation of exposure latitude as a function of depth of focus for the random pattern of FIG. 10c (on a 18% attenuated phase shift mask) illuminated with a bullseye illumination configuration according to an embodiment of the invention.
Figure 15B:
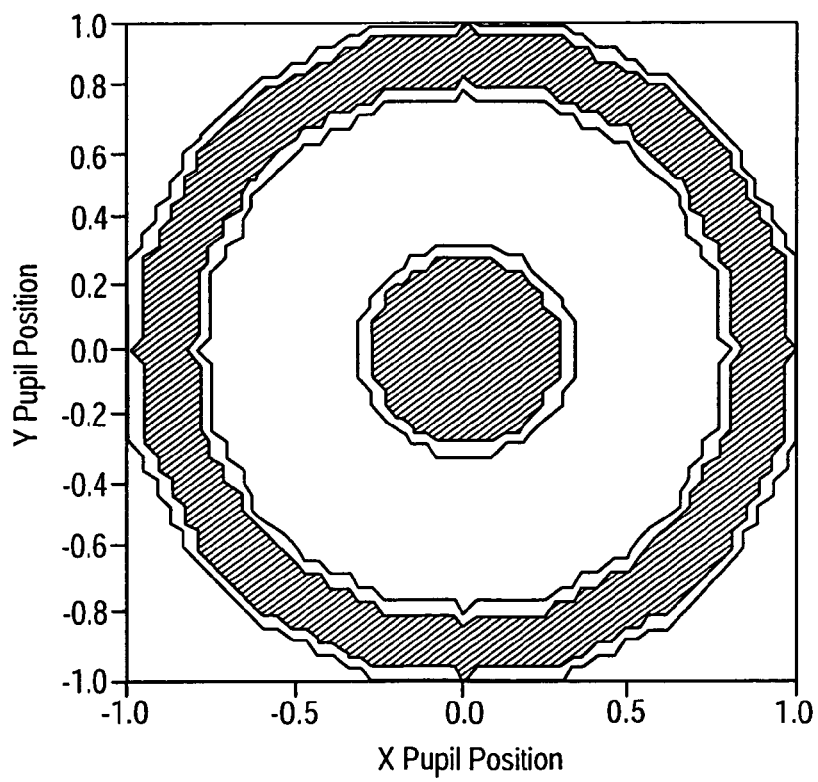

FIG. 15a shows the simulated variation of exposure latitude as a function of depth of focus for the same random pattern as in FIG. 10c illuminated with the bullseye illumination configuration of FIG. 15b. The bullseye illumination has a 0.35 radius conventional illumination and an annular illumination including a 0.8 inner radius and 1.0 outer radius. Calculations are performed with a 18% attenuated phase shift mask, a 45 nm mask bias and 0.93 NA liquid water immersion exposure process. A comparison of the contact hole size as measured on the mask to the printed contact hole size (in the photoresist) for selected holes of the random pattern used for FIG. 15a is given in Table 6. Results are given for the same contact holes previously identified. Table 6 also shows the dose to size value E1:1 for a CD of 74.97197.

TABLE 6

| Mask size | CD | E1:1 |
|---|---|---|
|  | 74.97197 | 32.421 |
| 112.0607 | 74.65926 |  |
| 123.8081 | 74.84603 |  |
| 120.5877 | 74.56219 |  |
| 120.138 | 75.09647 |  |
| 122.1175 | 74.99792 |  |
| 118.521 | 74.81227 |  |
| 119.9422 | 74.78689 |  |
| 120.4255 | 74.69791 |  |

FIG. 15a shows that a reasonably high depth of focus can be obtained with this illumination configuration. The minimum exposure latitude was about 5%, the minimum depth of focus was about 0.23 µm, and the MEEF was in the range of about 5.0-7.2. The tendency for densely located holes to merge is greater. Although not shown, simulations have demonstrated that the use of a phase shift mask with attenuations as high as about 30% provide satisfactory results. Furthermore, the inner radius of the annular illumination may have a normalized value between about 0.6 and 0.87.

Figure 16:
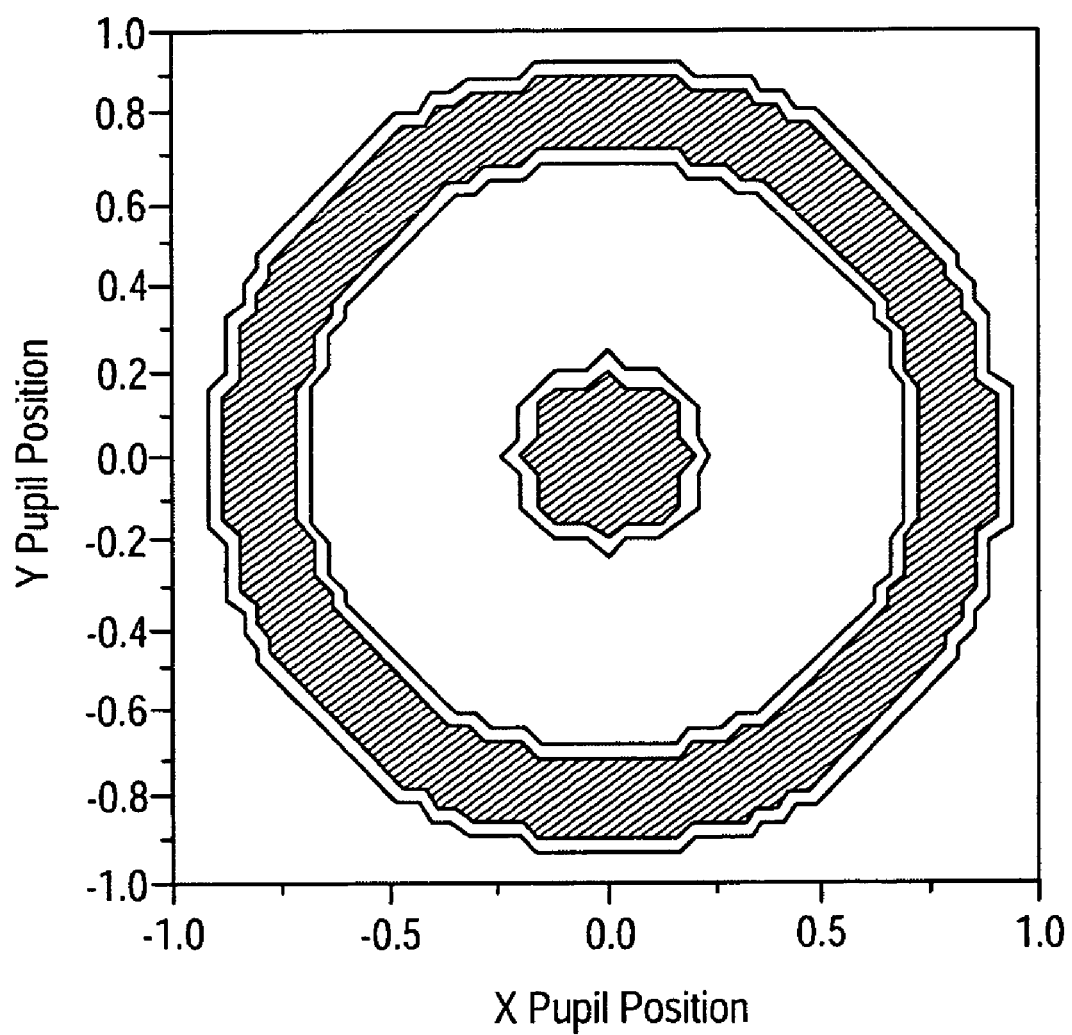
FIG. 16 shows a bullseye illumination configuration in accordance with an embodiment of the invention.

FIG. 16 shows a bullseye illumination configuration that provides good results in terms of focus and dose while at the same time providing better hole shape integrity. The same random pattern as in FIGS. 9-13 was used to optimize a bullseye illumination configuration having a 0.2 radius conventional illumination and 0.9/0.7 (outer/inner) radius annular illumination. Optimization was performed with a 9% attenuated phase shift mask, a 25 nm mask bias and a 0.93 NA liquid water immersion exposure process. Table 7 compares the contact hole size as measured on the mask to the printed contact hole size (in the photoresist) for selected holes of the random pattern used for the exposure using the illumination configuration of FIG. 16. Table 7 also shows the dose to size value E1:1 for a CD of 75.06969.

TABLE 7

| Mask size | CD | E1:1 |
|---|---|---|
|  | 75.06969 | 53.5923 |
| 94.9203 | 75.04066 |  |
| 101.5474 | 74.94169 |  |
| 99.27625 | 75.04936 |  |
| 98.87174 | 75.0195 |  |
| 100.8029 | 74.98233 |  |
| 101.2076 | 74.78883 |  |
| 100.7871 | 74.75171 |  |
| 101.2134 | 74.8559 |  |

Reasonably good hole integrity was possible and there was no bridging of contact holes.

The above embodiments indicate that the lithographic process for random patterns may be dramatically improved by appropriately combining a bullseye illumination configuration, a phase shift mask, and appropriate mask bias. Features corresponding to a minimum half-pitch $k_1$ factor of about 0.35 may successfully be imaged with a bullseye illumination.

It will be appreciated that the different acts involved in configuring the optical transfer of the mask pattern onto the substrate or the illumination condition of random patterns may be executed according to machine executable instructions. These machine executable instructions may be embedded in a data storage medium, e.g., of a control unit of the lithographic apparatus. The control unit may include a processor that is configured to control the adjusting device AM and to modify the cross-sectional intensity distribution in the beam exiting the illumination system IL.

In an embodiment of the invention, the machine executable instructions may be embedded in a computer product which can be used in conjunction with a simulation software, such as Prolith™, Solid-C™, Lithocruiser™, or the like. That is, the computer product may be configured to generate and input illumination files into the simulation software and instruct the simulation software to calculate an image of the desired pattern using, for example, an aerial or a full resist simulation. The computer product may then be configured to output the calculated image and to evaluate this image versus one or more criteria to judge whether the image has appropriate optical qualities to successfully print the desired mask pattern on the substrate.

Although specific reference may be made in this text to the use of lithographic apparatus in the manufacture of ICs, it should be understood that the lithographic apparatus described herein may have other applications, such as the manufacturing of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the mask and a first element of the projection system. Immersion techniques are well known in the art for increasing the numerical aperture of projection systems.

The methods described herein may be implemented as software, hardware or a combination. In an embodiment, there is provided a computer program comprising a program code that, when executed on a computer system, instructs the computer system to perform any or all of the methods described herein.

While specific embodiments of the invention have been described above, it will be appreciated that the invention may be practiced otherwise than as described. The description is not intended to limit the invention.

What is claimed is:

1. A method for configuring an illumination condition of a pattern of features in a mask pattern, the method comprising:
    configuring an illumination condition of a first grid including a plurality of said features, said plurality of features being arranged in a first pitch in said first grid;
    subsequent to configuring the illumination condition of the first grid, configuring an illumination condition of a second grid including a plurality of said features, said second grid being rotated with respect to said first grid; and
    determining the illumination condition of said pattern of features based on the illumination condition of said first grid and the illumination condition of said second grid.

2. The method of claim 1, wherein said plurality of features are arranged in a second pitch in said second grid.

3. The method of claim 2 wherein the configuring of the illumination condition of said first grid and the second grid is done by computer simulation.

4. The method of claim 1, wherein said first and second grids are substantially square grids.

5. The method of claim 1 wherein said pattern of features is a pattern of contact holes having a critical dimension smaller than about 120 nm.

6. The method of claim 1 wherein the illumination condition of said pattern of features comprises a union of illumination regions defining the illumination configuration of said first grid and illumination regions defining the illumination configuration of said second grid.

7. The method of claim 1 wherein said pattern of features is a random or irregular pattern of features.

8. A computer product, embodied in a computer-readable medium having machine executable instructions, said instructions being executable by a machine to perform a method for configuring an illumination condition of a pattern of features in a mask pattern, the method comprising:
    configuring an illumination condition of a first grid including a plurality of said features, said plurality of features being arranged in a first pitch in said first grid;
    subsequent to configuring the illumination condition of the first grid. configuring an illumination condition of a second grid including a plurality of said features, said second grid being rotated with respect to said first grid; and
    determining the illumination condition of said pattern of features based on the illumination condition of said first grid and the illumination condition of said second grid.

9. The computer product of claim 8 wherein said pattern of features is a random or irregular pattern of features.

10. A method for configuring an illumination condition of an irregular pattern of features in a mask pattern, the method comprising:
    configuring an illumination condition of a first regular pattern of features, the features being arranged in a first pitch in the first regular pattern;
    subsequent to configuring the illumination condition of the first regular pattern, configuring an illumination condition of a second regular pattern of said features, the second regular pattern of said features being rotated with respect to the first regular pattern; and
    determining the illumination condition of the irregular pattern of features based on the illumination condition of the first regular pattern and the illumination condition of the second regular pattern.

11. The method of claim 10 wherein the plurality of features are arranged in a second pitch in the second regular pattern.

* * * * *